United States Patent [19]

Oomori et al.

[11] Patent Number: 4,893,019
[45] Date of Patent: Jan. 9, 1990

[54] ION CURRENT GENERATOR SYSTEM FOR THIN FILM FORMATION, ION IMPLANTATION, ETCHING AND SPUTTERING

[75] Inventors: Tatsuo Oomori; Kouichi Ono; Shigeto Fujita, all of Amagasaki, Japan

[73] Assignee: Mitsubishi Denki Kabushiki Kaisha, Tokyo, Japan

[21] Appl. No.: 186,236

[22] Filed: Apr. 26, 1988

[30] Foreign Application Priority Data

May 27, 1987 [JP] Japan ................................. 62-134289
Jul. 27, 1987 [JP] Japan ................................. 62-186839
Aug. 19, 1987 [JP] Japan ................................. 62-205763

[51] Int. Cl.$^4$ ............................................. H01J 37/08
[52] U.S. Cl. ............................... 250/423 R; 250/423 P; 250/492.2; 250/493.1; 313/363.1; 313/231.41; 315/111.81
[58] Field of Search ............ 250/423 R, 423 P, 423 F, 250/424, 492.2, 493.1; 313/363.1, 362.1, 231.41; 315/111.81, 150

[56] References Cited

U.S. PATENT DOCUMENTS

| 3,914,655 | 10/1975 | Dreyfus et al. | 250/423 P |
| 4,020,350 | 4/1977 | Ducas | 250/423 P |
| 4,061,921 | 4/1978 | Cantrell et al. | 250/423 P |
| 4,070,580 | 1/1978 | Gallagher et al. | 250/284 |
| 4,433,241 | 2/1984 | Boesl et al. | 250/423 P |
| 4,692,627 | 9/1987 | Ueda et al. | 250/423 P |
| 4,716,295 | 12/1987 | Ueda et al. | 250/423 P |

FOREIGN PATENT DOCUMENTS 58-157043  9/1983  Japan ................................. 250/423 P Primary Examiner—Carolyn E. Fields
Assistant Examiner—John A. Miller
Attorney, Agent, or Firm—Oblon, Spivak, McClelland, Maier & Neustadt

[57] ABSTRACT

The ion current generator is employed for thin film formation, ion implantation, etching, sputtering or the like. A vaporizer supplies material atoms to a predetermined region, and then, the material atoms are excited to a Rydberg state by lasers supplied from laser oscillators. The material atoms thus excited are ionized by an electric field applied from electric field application means, to be lead to a predetermined direction. Accordingly, an ion current can be generated at a high efficiency and low cost.

77 Claims, 25 Drawing Sheets

ION CURRENT GENERATOR SYSTEM FOR THIN FILM FORMATION, ION IMPLANTATION, ETCHING AND SPUTTERING

BACKGROUND OF THE INVENTION

1. Field of the Invention

The present invention relates to an ion current generator employed in thin film formation process, ion implantation process, etching process, sputtering process and the like.

2. Description of the Prior Art

FIG. 1 is a cross section of an ion beam epitaxial growth system having a conventional ion current generator which is disclosed in Japanese Patent Laying Open Gazette No. 60-137012 (1985), for example. As shown in FIG. 1, the system comprises an ion source 1 and an extraction electrode 2 provided for extracting ions from the ion source 1. A mass analyzing system 3 of a three-dimensional focusing sector type is also provided for extracting ions of desired species from the ion beam obtained through the extraction electrode 2. A resolved aperture 4 is positioned on the exit side of the mass analyzing system 3. A deceleration system 5 which consists of three cylindrical lens 5A, 5B and 5C aligned in series is also provided for decelerating the ion beam having passed through the resolving aperature 4. In a vaporizer 6 provided at the position under the exit side of the deceleration system 5, atomic materials prepared for thin film formation is vaporized, to generate a vapor current. A substrate 7 on which a thin film is to be formed by means of the system is positioned on the exit side of the deceleration system 5. The voltage distribution indicated at the ion source 1, the extraction electrode 2, the mass analyzing system 3 and the deceleration system 5 respectively are examples suitable for supplying an As+ beam of 100 eV to the substrate 7 from the ion source 1.

In process of growing a GaAs compound semiconductor thin film on the substrate 7, for example, Ga vapor is supplied to the surface of the substrate 7 from the vaporizer 6 for depositing Ga atoms on the substrate 7. Simultaneously, an extraction voltage of about 25 KV is applied between the extraction electrode 2 and the ion source 1, so that an ion beam having As+ ions is extracted from the ion source 1. The extracted ion beam is introduced into the mass analyzing system 3 of the three-dimensional sector type, through which only a pure As+ beam is extracted from the ion beam having various ions. Then, the As+ beam enters the resolving aperture 4. the As+ beam having passed through the resolving aperature 4 is decelerated through the deceleration system 5. The As+ beam is implanted into the substrate 7 after being decelerated to a low energy state of about 100 eV or lower than the same. As a result, the GaAs thin film is formed on the substrate 7.

When the conventional ion beam epitaxial grown system having the ion current generator is employed, a considerably high voltage of about 25 KV should be applied between the ion source 1 and the extraction electrode 2 so that the As+ beam having a desired electric current may be obtained. The ion beam extracted through the extraction voltage of about 25 KV has high current velocity. In order to prevent the phenomena in which the beam spreads by a space charge effect in the beam pass from the mass analyzing system 3 to the substrate 7, the electric potential of the ion source 1 is held at 100V and the mass analyzing system 3 and the deceleration system 5 are held at deep negative potentials to maintain the high beam velocity. On the contrary, the beam velocity should be low when the beam is supplied to the substrate 7. More particularly, the beam velocity must be lowered so that the incident energy of the ion beam into the substrate 7 is lower than 300 eV, or preferably lower than 100 eV. This is because, if the As+ beam is supplied to the substrate 7 with an incident velocity corresponding to an energy in excess of 300 eV, the amount of GaAs sputtered by As+ ions is equal to or in excess of the amount of GaAs adhered to the substrate 7, so that the film is prevented from growing. Therefore, the ion beam should be decelerated just before reaching the substrate 7, and the deceleration is achieved by means of the deceleration system 5. However, in the conventional thin film formation system, an electrode provided in the deceleration system 5 should be long in the beam pass direction, since the beam must be decelerated at wide range. As a result, the raster scan of the ion beam supplied to the substrate 7 cannot be well controlled. Even if the raster scan is controlled, it is difficult to obtain an uniform distribution of the fim thickness, and it is almost impossible to selectively grow a thin film only on a local area on the substrate 7.

Furthermore, since the ion beam having desired purity is obtained through the process in which the original ion beam having various ions is extracted from the ion source 1 and then given to the mass analyzing system 3, the generation efficiency of the ion beam is low, and the cost and the size of the ion generation part are increased.

FIG. 2 is a cross section showing another conventional ion current generator employing a laser, which is disclosed Japanese Patent Laying Open Gazette 50-22999 (1975). As shown in FIG. 2, the ion current generator comprises a particle current generator 60 for supplying the materials to be ionized as a form of atom current 65 moving in a certain direction, and dye laser oscillators 61a, 61b and 61c for radiating lasers having uniform wavelengths being different from each other, respectively.

Lasers 62a, 62b and 62c are provided for focusing the lasers 67a, 67b and 67c radiated from the dye laser oscillators 61a, 61b and 61c at a common point P, respectively. With an electrode 64, only ions are extracted from an atomic current 63 including the ions obtained by ionizing a part of the atomic current 65 by the lasers 67a, 67b and 67c, to be led to a certain direction.

When the ion current generator is employed for ionizing Na atoms, the Na atoms are supplied to the particle current generator 60, and the atom current 65 of Na is emitted from a nozzle 66 to a certain direction with a constant velocity. At the point P, the atom current 65 is irradiated with the laser 67a (589 nm) and the laser 67b (568.8 nm). As a result, the Na atoms are excited from a ground state $3s^2S_{\frac{1}{2}}$ to a $4d$ state a through $3p^2P_{3/2}$ state.

FIG. 3 is an energy level diagram of a Na atom. As understood from FIG. 3, the $4d$ state of the Na atom exists under the ionization limit level by 7000 $cm^{-1}$. When the third laser oscillator 61c is adjusted so that the laser 67c may have wavelength shorter than 1.4 μm, the Na atom in the $4d$ state is directly ionized by the laser 67c. Accordingly, the atom current 63 having passed the point P includes ions partially, and it is supplied to the electrode 64. Since a uniform electric field is being generated by the electrode 64, only the ions included in the atom current 63 are deflected by the electric field. As a result, only the ion are extracted to a certain direction.

Power densities of the lasers 67a, 67b and 67c required for ionizing the Na atoms with a high efficiency at the point P are about 10 W/cm², about 40 W/cm² and about 10⁷ W/cm², respectively, provided that the line width of the lasers are identical with the absorption wavelength band width of respective transitions. Namely, since Einstein's A coefficient in the transition of the Na atom from the 3s²S$_{\frac{1}{2}}$ state to the 3p²P$_{3/2}$ state (transition wavelength of 589 nm is about $6.3 \times 10^7$ sec⁻¹, the minimum power density of the laser 67a required for saturating the excitation from the groud state to the 3p²P$_{3/2}$ state is about 10 W/cm². Since Einstein's A coefficient in the transition of the Na atom from the 3p²P$_{3/2}$ state to the 4d state (transition wavelength of 568.8 nm) is about $1.3 \times 10^7$ sec⁻¹, the minimum power density of laser 67b required for saturating the excitation from the 3p²P$_{3/2}$ state to the 4d state is about 40 W/cm². Furthermore, since the absorption cross section of a light corresponding to the ionization of the 4d Na atom is about $10^{-18}$ cm², the minimum power density of the laser 67c required for ionizing the 4d state Na atom is about 10⁷ W/cm².

Accordingly, a laser having power density larger than 10⁷ W/cm² should be applied to the Na atom to ionize the Na atom by the laser.

In order to increase the power density of the laser, the laser may be focused. However, when such a technique is employed, atoms only in a small region are ionized, so that the amount of the obtained ions is decreased.

Further, the laser cannot be focused on an area having a diameter smaller than about several ten μm according to the present level of a laser technology, and therefore, the area is about several $10^{-5}$ cm² in maximum. On the other hand, the output energy of a continuous laser oscillator is smaller than 1 W, so that the maximum power density obtained by the laser oscillator is the order of 10⁵ W/cm². Thus, the continuous laser oscillator cannot be employed as the third laser oscillator 61c.

On the contrary, the maximum output of about 10⁶ W can be obtained in a pulse dye laser oscillator available commercially. When the pulse dye laser oscillator is employed, a desired ion beam can be generated. However, in the pulse laser oscillator, the amount of the ion obtained per unit time is proportial to the frequency of the pulse oscillation, provided that the laser radiation time per one pulse is constant. For this reason, a pulse dye laser oscillator with the high oscillation frequency should be employed when a large amount of the ions are required.

When the ion density of the ion beam is more than $10^{10}$ cm⁻³, the special field generated by the ions themselves exceeds 3 KV/cm, and the ions undesirably spread in the path from the point P to the electrode 64. Therefore, the maximum ion density of the ions entering the electrode 64 is $10^{10}$ cm⁻³.

In general, the value of the current density j (A/cm²) is calculated through the following formula:

$$j = N_i e f_L \quad (1)$$

where,
$n_i$: the amount of the ions per one pulse,
e: the charge of an electron, and
$f_L$: the oscillation frequency of a laser.

The oscillation frequency of a pulse dye laser oscillator is about 1 KHz in maximum. Assuming that the amount $n_i$ of the ions per one pulse, the charge e of the electron and the repeatation frequency $f_L$ of the laser are $10^{10}$ cm⁻³, $1.6 \times 10^{-19}$ Coulomb and 1 KHz, respectively, these values are substituted in the formula (1) to give the current density j as $1.6 \times 10^{-6}$ (A/cm²). Thus, in a case that the pulse dye laser oscillator is employed, the current density of the ion beam outputted therefrom is about several one μ A/cm², and an ion beam having a large current density is hardly obtained.

Furthermore, since the life time of the pulse dye laser oscillator is over when it has oscillated by 10⁹ shorts, the life time is estimated as about 300 hours in a case that the oscillation frequency of the oscillator is 1 KHz, so that the laser oscillation often stops undesirably and the oscillator should be often repaired.

SUMMARY OF THE INVENTION

An ion current generator according to the present invention comprises: (a) material atom supply means for supplying a particle current such as an atom current or a molecule current having material atoms to a predetermined region; (b) laser generating means for radiating a laser into said region to excite said material atoms into a Rydberg state; and (c) electric field application means for applying an electric field having a predetermined field strength to said material atoms being in said Rydberg state whereby said material atoms may be ionized to be lead in a predetermined direction.

Accordingly, an object of the present invention is to provide an ion current generator which can generate an ion current in high efficiency and at a low cost.

Another object of the present invention is to provide an ion current generator which can supply the generated ion current to a desired region at a prescribed velocity and with a high accuracy.

Further another object of the present invention is to provide an ion current generator in which an ion current is generated with a low power laser oscillator.

Further another object of the present invention is to provide an ion current generator which can generate an ion current having a large electric current.

Further another object of the present invention is to provide an ion current generator which can be easily maintained.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Principle of Ion Current Generation

Figure 4:
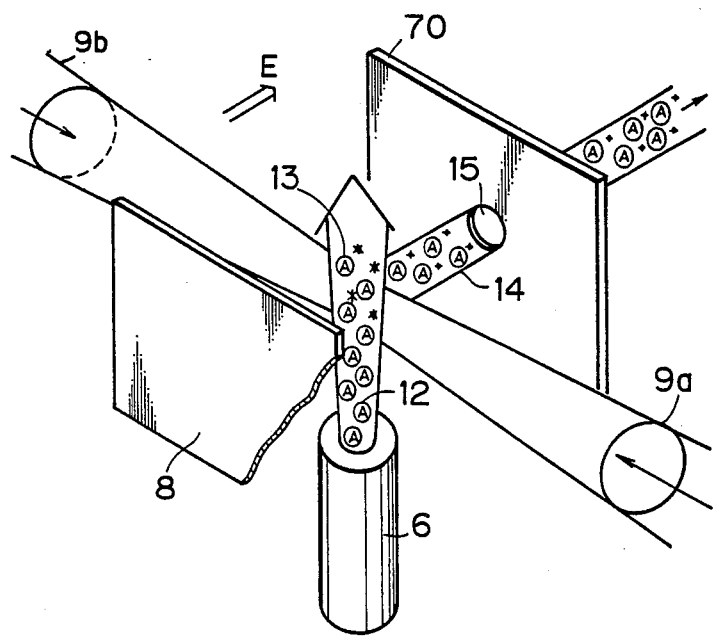
FIG. 4 is a diagram showing the principle of ion generation according to the present invention.

FIG. 4 is a diagram showing the principle of ion current generation according to the present invention. A first electrode 70 having a hole 15 at the center thereof and a second electrode 8 of flat plate type facing the first electrode 70 are arranged in parallel. A vaporizer 6 (material atoms supply means) for vaporizing material atoms to be ionized is so provided that the vaporizer 6 may supply the material atoms to the space between the first and second electrodes 70 and 8 as an atom current 12. Furthermore, the material atoms being supplied to the space between the first and second electrodes 70 and 8 are irradiated with lasers 9a and 9b having excitation wavelength $\lambda_1$ and $\lambda_2$, respectively, so that certain material atoms included in the atom current 12 which is supplied from the vaporizer 6 are excited from a ground state to an intermediate excited state by the laser 9a and then excited from the intermediate excited state to a Rydberg state by the laser 9b. Although it is not shown in FIG. 4, a high voltage pulse generator is connected with the electrode 8 to generate a pulse electric field E in a space between the first and second electrodes 70 and 8.

In the case where a Na ion beam is to be generated, for example, an ion current is generated as follows: The vaporizer 6 as the atom current generating means is prepared so as to vaporize Na atoms for generating the Na atom current 12. As the lasers indicated above, pulse dye lasers 9a and 9b for two stage excitation of the Na atoms from a ground state to a Rydberg state are employed. The laser 9a is a pulse dye laser for optically exciting the Na atoms from the ground state (3s state) to an intermediate state (3p state). The wavelength $\lambda_1$ of the laser 9a is 589.0 nm, the laser energy thereof is about 100 μJ, the laser pulse width thereof is about 8 ns, and the laser line width thereof is about 5 cm$^{-1}$. On the other hand, the laser 9b is another pulse dye laser for optically exciting the Na atoms from the intermediate state (3p state) to the Rydberg state having a principal quantum number equal to or larger than 20 (namely, ns state or nd state, where n is an integer satisfying n≧20). The wavelength $\lambda_2$ of the laser 9b can be changed within the range from 404 nm to 414 nm, the laser energy thereof is about 100 μJ, the laser pulse width thereof is about 15 ns, and the laser line width thereof is 0.2 cm$^{-1}$. Between the first and second electrodes 70 and 8, the pulse electric field E whose strength is equal to or less than 5 KV/cm is generated. In FIG. 4, the situation where the Na atom current 12 is excited from the ground state to the Rydberg state by the lasers 9a and 9b is illustrated as Rydberg atoms 13, while the situation where the Rydberg atoms 13 are ionized by the electric field E and led to the first electrode 70 as a Na ion current, is expressed as an ion beam 14. The ion beam 14 is introduced into an ion detector (not shown) through the hole 15. The various characters of the ion beam 14 are then detected by the ion detector.

Figure 5:
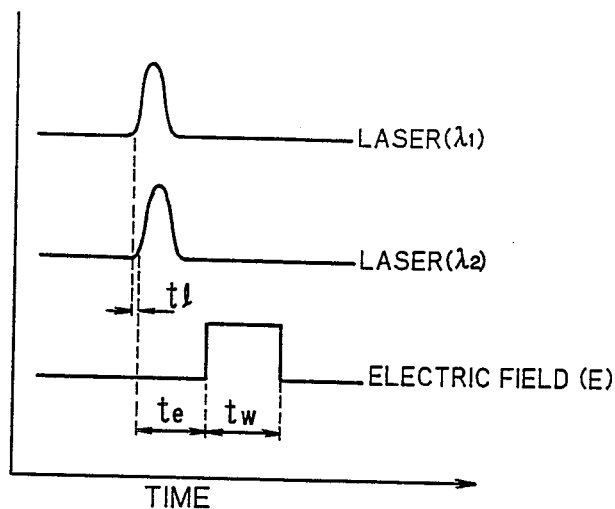
FIG. 5 is a diagram showing supply timing of a laser and application timing of an electric field.

FIG. 5 is a timing chart showing the ralation between supply timing of the lasers 9a and 9b and application timing of the electric field E. As understood from FIG. 4, the laser 9b (excitation wavelength $\lambda_2$) for exciting the Na atoms from the intermediate excited state to the Rydberg state is supplied to the Na atom current 12 with a delay of time interval $t_l$, after the laser 9a (excitation wavelength $\lambda_1$) for exciting the Na atoms from the ground state to the intermediate excited state is applied thereto. The value of the delay time $t_l$ should be so set as to be equal to or shorter than the life time of the intermediate excited state of the Na atoms, which is about 15 ns, and the delay time $t_l$ has a value equal to or shorter than about 5 ns, in this embodiment. The pulse electric field E is applied to the space between the first and second electrodes 70 and 8 with a delay time $t_e$ after the laser 9b (wavelength $\lambda_2$) is supplied, as shown in FIG. 5. The delay time $t_e$ must be shorter than the life time of the Rydberg state, and is about 50 ns, in this embodiment. The application time of the pulse electric field E, which is the pulse width $t_W$ shown in FIG. 5, is about 500 ns in this embodiment.

Figure 6:
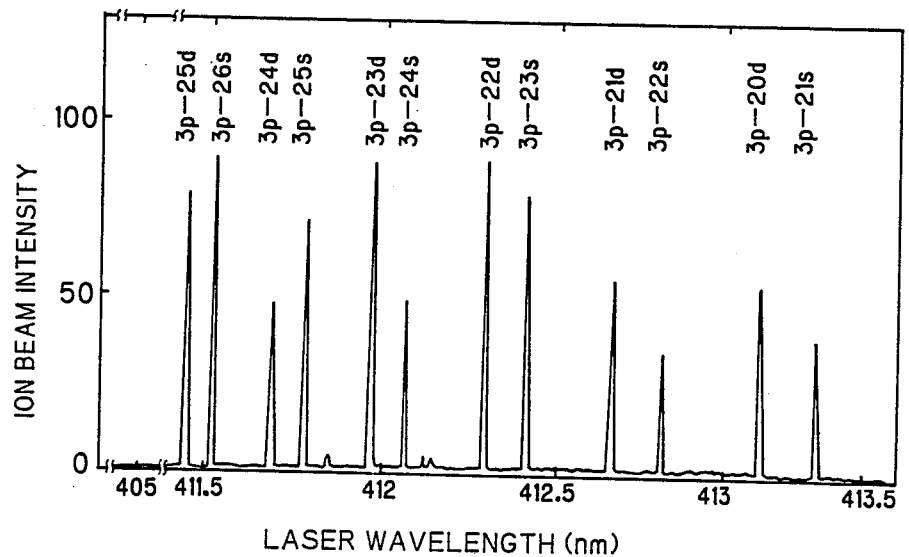
FIG. 6 is a graph showing dependence of the strength of an ion beam on the wavelength of the laser.

When the lasers 9a and 9b are supplied to the Na atom current 12 in the timing described above, the atom current 12 evaporating from the vaporizer 6 is excited from the ground state to the intermediate excited state by the laser 9a, and then excited from the intermediate excited state to the Rydberg state by the laser 9b, to become the Rydberg atoms 13. The Rydberg atoms 13 are then ionized by the electric field E applied to the space between the first and the second electrodes 70 and 8. The ionized Na is led to the first electrode 70 side as the ion beam 14, and passes through the hole 15 provided in the first electrode 70, to be detected at the ion detector (not shown). FIG. 6 is a graph showing the result of ion beam intensity measurements in which the wavelength of the laser 9b (excitation wavelength $\lambda_2$) is varied within the range from 405 nm to 413.5 nm under the condition that the relation between the supply timing of the lasers 9a and 9b and the application timing of the electric field E is set as shown in FIG. 5. As seen from FIG. 6, generation of the ion beam 14 is observed only when the excitation wavelength $\lambda_2$ has the same value as the transition wavelength of Na for the transition from the intermediate excited state to the Rydberg state. Since the generation of ion beam 14 is observed in the system of FIG. 4, it is confirmed that ionization in high efficiency can be achieved by means of a low power laser oscillator when the Rydberg atoms 13 are ionized by the electric field E.

Figure 7:
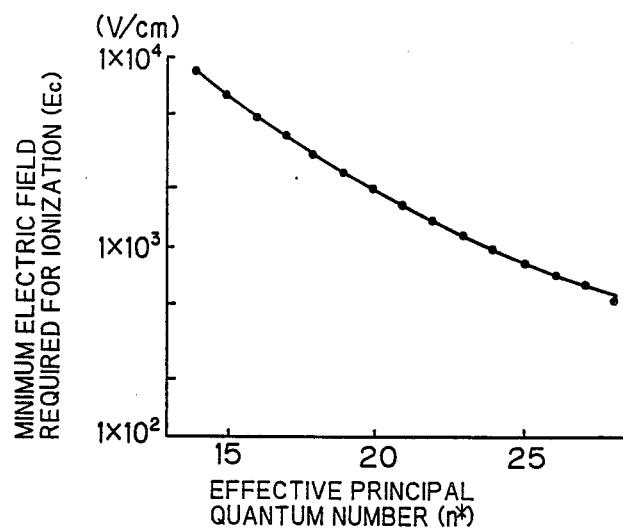
FIG. 7 is a graph showing a correlation between the minimum field required for ionizing a material atom being in a higher excited state and an effective principal quantum number.

According to "Rydberg States of Atoms and Molecule", R. F. Stebbings et al., Cambridge University Press, London, 1983, the minimum electric field $E_C$ required for ionizing the Rydberg atoms 13 excited into Rydberg state is:

$$E_C \approx 3.21 \times 10^8 (n^*)^{-4} \text{ [V/cm]} \quad (2)$$

where $n^*$ is the effective principal quantum number of the Rydberg atoms. Therefore, as shown in FIG. 7, the minimum electric field $E_C$ is drastically decreased when $n^*$ is increased. $E_C$ is about 2 KV/cm at $n^*=20$, and $E_C$ is about 830 V/cm at $n^*=25$.

Figure 8:
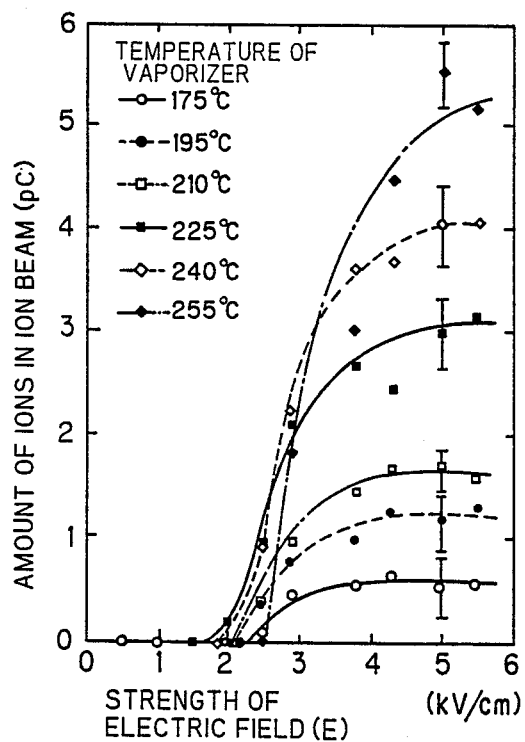
FIG. 8 is a showing a correlation between the strength of an electric field generated between a substrate and an electrode, and the amount of ions included in the ion beam.

FIG. 8 is a graph showing a quantative change of ions included in the ion beam 14 which is caused by the change of the strength of the electric field E applied to the space between the first electrode 70 and the second electrode 8. The amount of the ions were measured under the condition that the laser 9b (excitation wavelength $\lambda_2$) is fixed at the transition wavelength required in the transition from the intermediate excited state to the Rydberg state of 20d, and the temperature of the vaporizer 6 is set at 175° C., 195° C., 210° C., 225° C., 240° C. and 255° C., respectively. As seen from FIG. 8, while the strength of the electric field E is lower than 2 KV/cm which is obtained from the expression (2), generation of the ion beam 14 is not observed. On the contrary, the generation of the ion beam 14 is observed as the strength increases over 2 KV/cm, and further increase of the strength of the electric field E brings a drastic increase of the amount of the ions included in the ion beam 14. When the strength of the electric field E is larger than several one KV/m, the charge of the ion beam 14 is saturated. There is a correlation between the amount of the saturation charge and the atomic density of the laser irradiated region which is presumed from the temperature of the vaporizer 6. Namely, the amount of the saturation charge in the ion beam 14 coincides with that obtained through the calculation which is performed under the condition that the transition to the Rydberg state of the atoms in the region irradiated laser is saturated and all of the Rydberg atoms 13 are ionized.

Through these analyses, the following conclusions are delivered:

(i) The strength of the electric field E required for generating the ion beam 14 may be lower than several one KV/cm;

(ii) the strength of the electric field E required for generating the ion beam 14 decreases as the effective principal quantum number of the Rydberg atoms 13 increases;

(iii) the ionization has a threshold character with respect to the strength of the electric field E, namely, no ionization is observed at the electric field having weak strength lower than that obtained through the expression (2), while almost all of the Rydberg atoms 13 are ionized when the strength exceeds a threshold value;

(iv) the generation amount of the ion beam 14 can be controlled by changing the strength of the electric field E; and (v) the amount of the generated ions almost coincides with that of the Rydberg atoms 13 excited by the laser 9b, and almost all of the Na atoms included in the atom current 12 are ionized.

Figure 9:
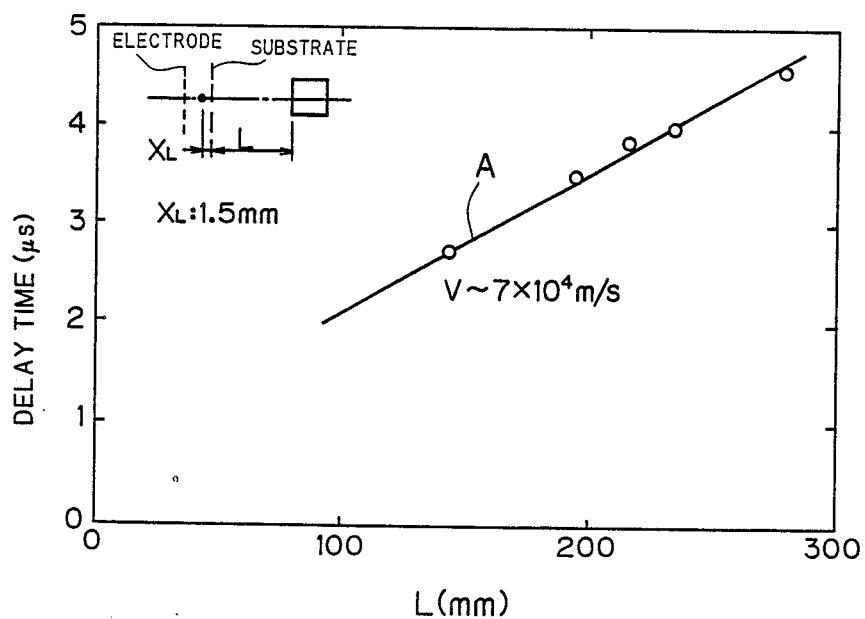
FIG. 9 is a graph showing the velocity of the ion beam supplied to the substrate, which is obtained by means of a time of flight technique.

FIG. 9 is a graph showing the result of velocity measurements of the ion beam 14, which were performed using a time of flight technique. The lateral axis expresses the distance L (mm) from the first electrode 70 to the ion detector, while the vertical axis expresses the delay time ($\mu$s) with which the ions are detected in the ion detector after the electric field E is applied at the timing shown in FIG. 5. The characteristic line A shown in FIG. 9 expresses the result of the measurements when the strength of the electric field E applied to the space between the first electrode 70 and the second electrode 8 is set at 5 KV/cm, and the lasers 9a and 9b are so focused as to have a diameter of about 1 mm$\phi$ at the position being apart from the first electrode 70 by a distance $X_L$ of 1.5 mm toward the second electrode 8. From the characteristic line A of FIG. 9, a velocity of about $7 \times 10^4$ m/s is obtained as that of the ion beam 14 generated under the above indicated condition. The energy corresponding to the beam velocity is about 550 eV, which almost corresponds to the product of the strength of the electric field E and the distance $X_L$ from the first electrode 70 to the laser focused position. Further, in proportion as the strength of the electric field E applied in the space between the first and second electrodes 70 and 8 is increased, the velocity of the ion beam 14 changes. For example, when the strength of the electric field E is 2 KV/cm, the energy corresponding to the beam velocity is about 200 eV. From these facts, it is understood that the low energy ion beam 14 having energy equal to or lower than several hundred electron volts can be easily generated by adjusting the strength of the electric field E and/or the distance $X_L$ from the first electrode 70 to the laser focused position.

B. Embodiments of Ion Current Generator

Figure 10:
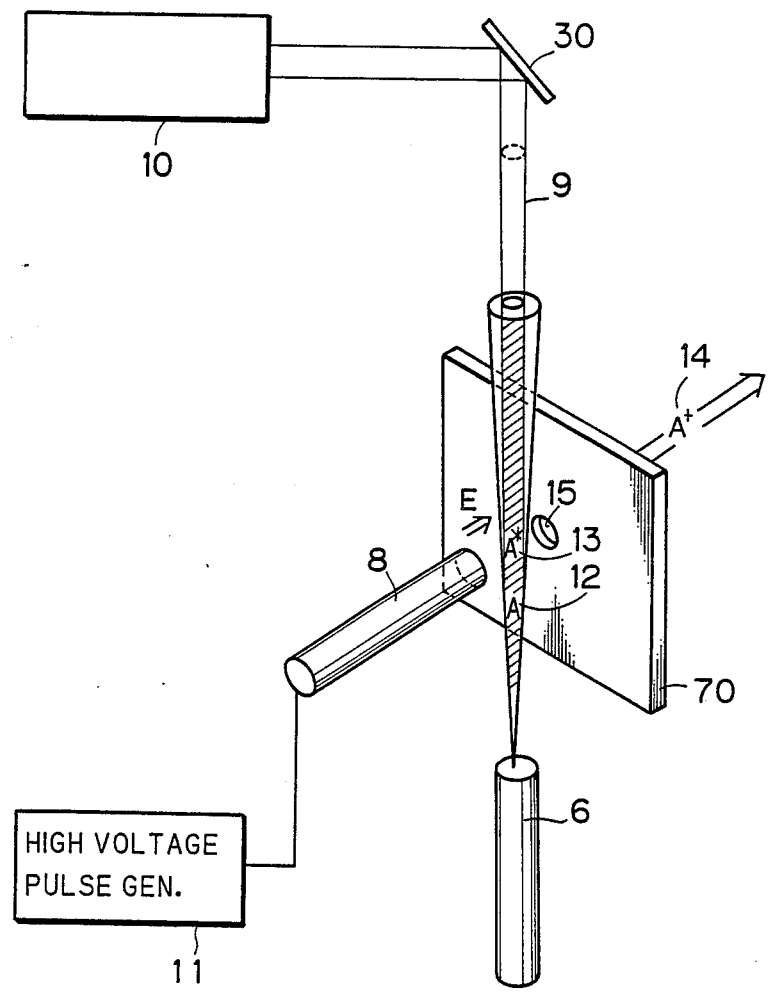
FIG. 10 is a schematic diagram showing an ion current generator according to a first embodiment of the present invention.

FIG. 10 is a diagram showing an ion current generator according to the first embodiment of the present invention. As shown in FIG. 10, the ion current generator has a first electrode 70 provided with a hole 15 in the center thereof, the hole having a predetermined shape. A second electrode 8 whose shape is a cylinder having end surfaces sized in proportion to the size of the hole 15 provided in the first electrode 70 is also provided. The second electrode 8 is so positioned that one of the end surfaces faces the hole 15 of the first electrode 70. A vaporizer 6 (material atoms supply means) is given at the position under the first and second electrode 70 and 8 for supplying material atoms to be ionized to the space between the first and second electrodes 70 and 8. Laser generating means 10 is provided at the position above the first and second electrodes 70 and 8 for exciting certain material atoms included in an atom current 12, which is supplied from the vaporizer 6, from a ground state to a Rydberg state. The ion current generator further has light pass adjusting means for adjusting the light pass of a laser 9 so that the light pass of the laser 9 and the atom current 12 may be aligned coaxial and the incoming direction of the laser 9 may be in opposite direction to the current direction of the atom current 12. A high voltage pulse generator 11 is connected with the second electrode 8 for applying a pulse electric field E to the space between the first and the second electrodes 70 and 8.

The size of the end surfaces of the second electrodes 8 is determined in proportion to the size of the hole 15 provided in the first electrode 70, as described above, and it is preferred to so determine the diameter of the end surface that it is larger than the diameter of the laser 9 in order to improve the ionization efficiency.

According to an analysis of the case where an ion beam including material atoms is generated by the generator of FIG. 10, the material atoms emitted from the vaporizer 6 is excited from a ground state to a Rydberg state state, by the laser 9 supplied from the opposite direction to the material atoms supplying direction. The excited Rydberg atoms 13 are supplied to the space between the first and second electrodes 70 and 8 to be ionized by the electric field E. The ions thus generated are accelerated by the pulse electric field E toward the first electrode 70, to be extracted through the hole 15 in the first electrode 70.

Figure 1:
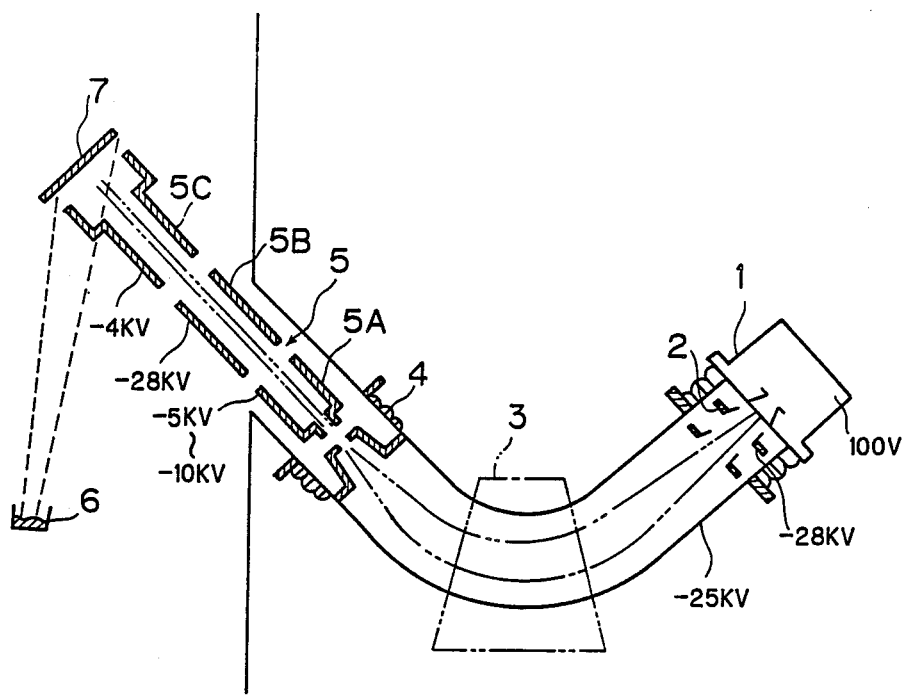
FIG. 1 is a cross section showing an ion beam epitaxial growth system employing a conventional ion current generator.
Figure 2:
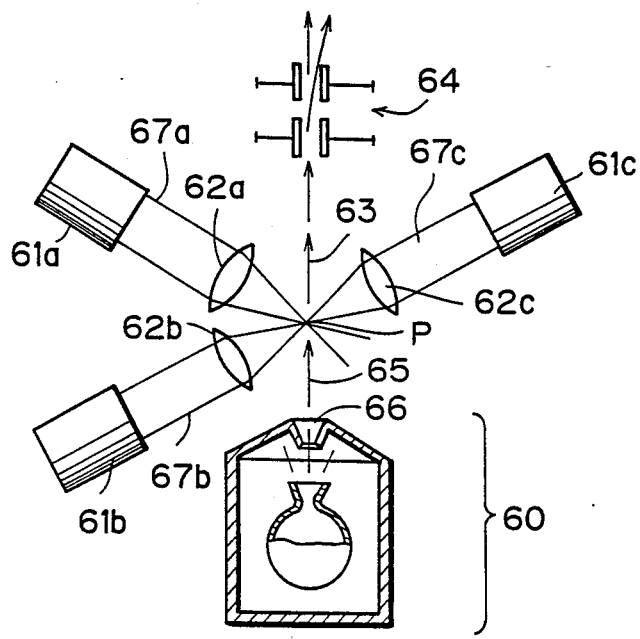
FIG. 2 is a cross section showing another conventional ion current generator.
Figure 3:
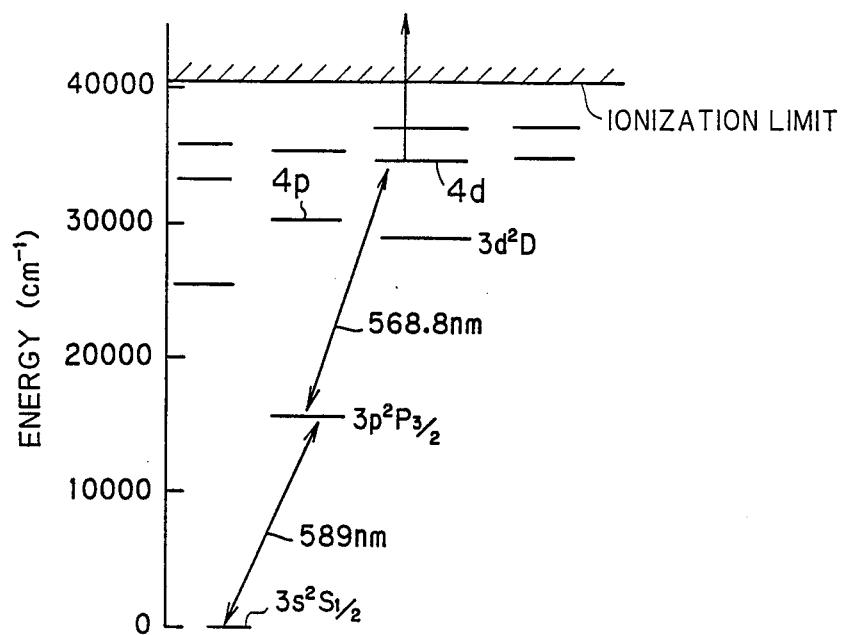
FIG. 3 is an energy level diagram showing an example of a state transition of a Na atom.

Since the embodiment is so constructed that the material atoms are ionized by applying the pulse electric field E to the material atoms being in the Rydberg state, it is not required to ionize the material atoms by a laser in the last stage of ionization, and therefore, the ion current can be generated with a laser oscillator whose output energy density is lower than that of the oscillator of FIG. 2 employed in the prior art.

When the construction shown in FIG. 10 is employed, not only the material atoms existing between the first and second electrodes 70 and 8 but also the all material atoms included in the atom current 12 irradiated with the pulse laser 9 are excited from the ground state to the Rydberg state. Further, once the material atoms are excited to the Rydberg state, the material atoms remain at the Rydberg state for a certain time period even after the supply of the pulse laser 9 is stopped. Therefore, when the atom current 12 is irradiated with the pulse laser 9, the material atoms in the Rydberg state are supplied from the upper stream side of the atom current 12 to the space between the first and second electrodes 70 and 8 by the certain time period, in every pulse irradiation. Under the circumstance, when the pulse electric field E having a frequency whose corresponding period is set to be shorter than the life time of the Rydberg state of the material atoms is applied to the space between the first and second electrodes 70 and 8, the material atoms are ionized to be extracted to the exterior through the hole 15 synchronously with the application timing of the pulse electric field E. It is delivered from this fact that, in proportion as the frequency of the pulse electric field E in increased, the extraction frequency is increased, so that the ion beam having a large electric current is generated. When the time interval with which a pulse radiation is followed by the next pulse radiation is set to be equal to or more than the life time of the material atoms in the Rydberg state, the frequency $F_I$ of the extraction of the ion beam 14 per unit time is given as:

$$F_I = C_E F_R \tag{3}$$

where $C_E$ is the number of pulses of the pulse electric field E which is applied to the space between the first and second electrodes 70 and 8 from the time when the material atoms are irradiated with the laser 9 to the time when the life time of the Rydberg state of the material atoms is over, and $F_R$ is the oscillation frequency of the pulse laser 9. As understood from the Eq. (3), the ion beam having larger electric current than the conventional one can be generated by setting the pulse number $C_E$ of the pulse electric field E at a value equal to or more than two, even if the oscillation frequency $F_R$ of the pulse laser 9 is identical to that of the conventional one.

Modifying the Eq. (3), the following expression is obtained:

$$F_R = F_I / C_E \tag{4}$$

As seen the Eq. (4), the oscillation frequency $F_R$ of the laser 9 required for extracting the ion beam by a certain times of $F_I$ decreases in proportial to the increase of the pulse numbers $C_E$ of the pulse electric field E. Thus, in th case where the ion beam having a predetermined value of the electric current is to be generated, the oscillation frequency $F_R$ of the pulse laser 9 can be decreased in proportion as the pulse number $C_E$ is increased, so that the life time of the pulse laser oscillator is lengthened through the decrease of the laser radiation frequency.

Figure 11:
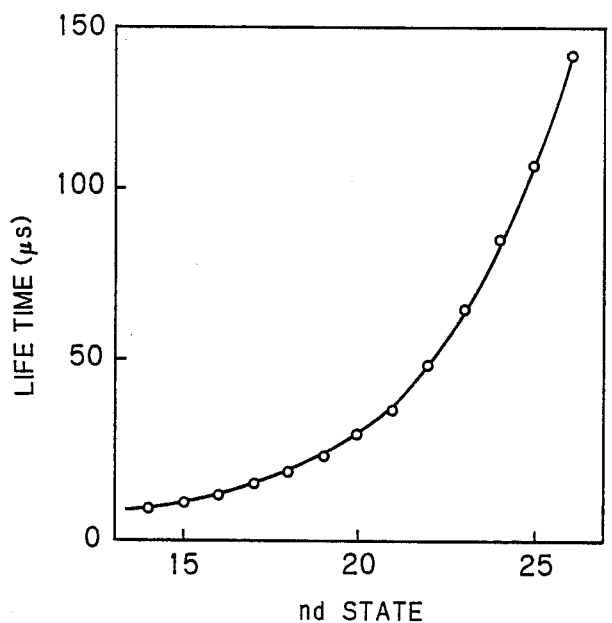
FIG. 11 is a graph showing a relation between the life time of the Na atom being in a Rydberg state and the principal quantum number (n) of the same.

FIG. 11 is a graph showing a relation between the life time of the Rydberg state of the Na atom and the principal quantum number (n) of the Na atom. Referring to FIG. 11, the radiative life time of the Rydberg state is lengthened as the principal quantum number (n) of the Na atom in increased. When the principal quantum number of the Rydberg state is 20, the radiative life time of the Rydberg state is about 30 $\mu$s. Accordingly, once the Na atom is excited to the 20d state, the Na atom remains at the 20d state for 30 $\mu$s without further irradiation with the laser 9.

Figure 12:
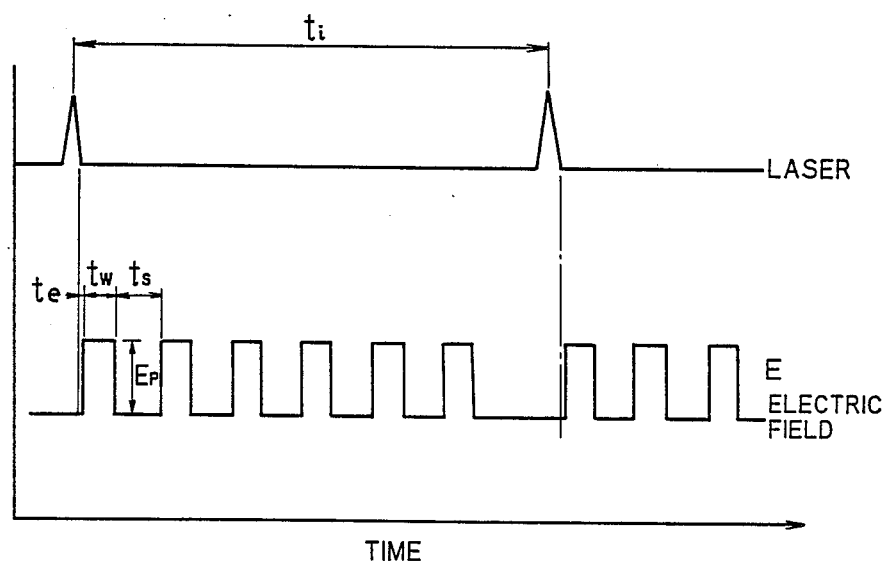
FIG. 12 is a time chart showing supply timing of the laser and application timing of the electric field in the first embodiment.

Therefore, from the ion current generator of FIG. 10, an ion beam having an electric current larger than that generated in the conventional one can be extracted in the timing shown in FIG. 12. As shown in FIG. 12, the laser 9 for exciting the Na atoms from the ground state to the 20d state is repeatedly supplied to the Na atom current 12 with a repetation period $t_i$. Further, the pulse electric field E is applied to the space between the first and second electrodes 70 and 8 in the timing shown in FIG. 12.

For example, the oscillation period $t_i$ of the laser, the delay time $t_e$ of the electric field application, the electric field application time $t_W$ and the electric field pause time $t_s$ are set at about 1 ms, about 40 ns, about 400 ns and about 600 ns, respectively, and the strength of the electric field E is set at 5 KV/cm$^2$.

Under the condition described above, the Na atoms in 20d state existing between the first and the second electrodes 70 and 8 are easily ionized, since the strength $E_P$ of the electric field applied to the space between the first and second electrodes 70 and 8 after the supply of the laser 9 is 5 KV/cm². The Na ions thus generated are accelerated by the electric field E toward the first electrode 70, and then extracted to the exterior through the hole 15 in the first electrode 70.

In the timing chart of FIG. 12, when the first pulse electric field E is applied to the space between the first and second electrodes 70 and 8 after supply of the laser 9, a Na ion beam 14 is generated by the time period $t_W$ (about 400 ns) as described above. Then, the supply of the electric field E is stopped, so that the generation of the ion beam 14 stopped and the state lacking for the ion beam continues for the time period $t_S$ (about 600 ns). However, Na atoms excited during the time period $t_S$ are supplied to the space between the first and second electrodes 70 and 8 from the upper stream side of the atom current 12, as described above. When the electric field E is again applied to the space between the first and second electrodes 70 and 8, a Na ion beam 14 is generated for the time period $t_W$, similarly to the above. During the Na atoms are in the 20d state, the extraction of the ion beam and the supply of the excited Na atoms are alternately repeated with a period of about 1 μs which is a sum of the time $t_W$ and $t_S$. In order to obtain high efficiency in the ion beam generation, it is preferred that the time $t_S$ is set to be equal to or longer than the time required for the Na atoms to pass through the space between the first and second electrodes 70 and 8. This is because, if the time $t_S$ is set to be shorter than the time required for the Na atoms to pass through the space between the first and second electrodes 70 and 8, only a part of the space between the first and second electrodes 70 and 8 is supplied with Na atoms in the 20d state when the next pulse electric field E is applied, so that the ion generation efficiency is decreased.

From the analysis described above, it is understood that the electric current of the ion beam extracted under the condition described above is about thirty times that obtained by the conventional generator shown in FIG. 2. This is because the life time of the Rydberg state, which is the 20d state of a Na atom, is about 30 μs, and the repetition period of the pulse electric field E is about 1 μs, so that the pulse number $C_E$ of the pulse electric field E is thirty. As found from Eq. (4), the oscillation frequency $F_R$ of the laser 9 required for the exstraction of the pulse ion beam by one thousand times per unit time is about 33 Hz. Comparing the result with that of the conventional case shown in FIG. 2 in which the oscillation frequency of the laser required for the extraction of the ion beam by one thousand times per unit time is 1 KHz, the oscillation frequency can be lowered in the present invention. In other words, the laser radiation frequency required for the generation of a ion beam having a desired electric current can be decreased, so that the life time of the laser oscillator can be lengthened. As a result, the laser oscillator can be easily maintained.

Although the Na atoms are excited to the 20d state in the above described embodiment, the Na atoms may be excited to other Rydberg state having a large principal quantum number whose life time is equal to or longer than 30 μs. For example, it is supposed that the Na atoms are excited to a Rydberg state having a principal quantum number corresponding to longer life time than 1 ms. In this case, since the life time of the Rydberg state of the Na atoms is equal to or longer than the oscillation frequency $t_i$ of the laser 9, the Na atoms in the Rydberg state are continuously supplied to the space between the first and second electrodes 70 and 8. Accordingly, the extraction frequency $F_I$ of the ion beam per unit time is determined by the frequency of the applied electric field E. Since the repetition period ($t_W + t_S$) of the pulse electric electric field E is 1μs, the frequency of the applied electric field E is 1 MHz. Therefore, the extraction frequency $F_I$ of the ion beam per unit time is 1 MHz, so that an ion beam having an electric current of several one mA/cm² can be extracted.

Figure 13:
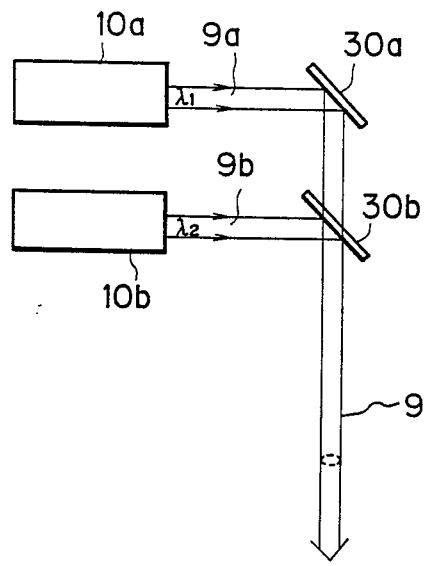
FIG. 13 is a diagram showing a configuration of a laser generation means and a laser pass adjuster shown in FIG. 10.
Figure 14:
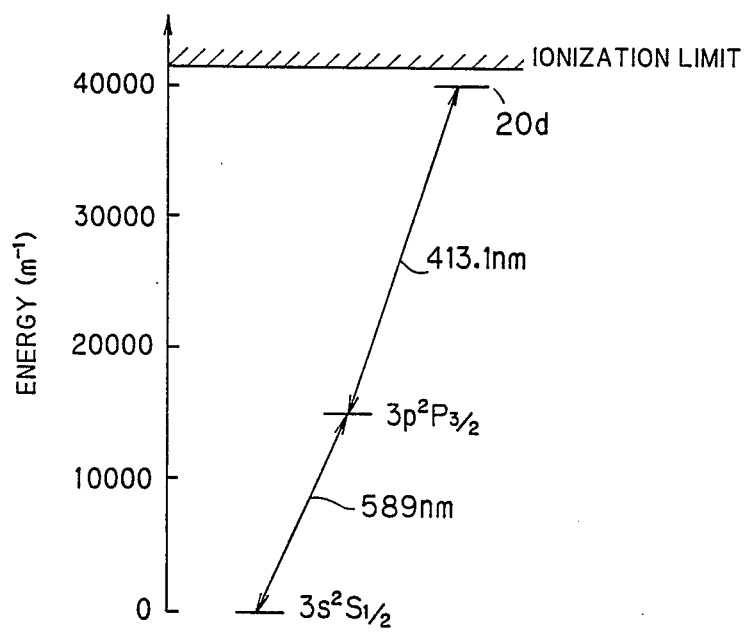
FIG. 14 is an energy level diagram showing a transition of the Na atom from the ground state to the Rydberg state which is caused by the laser supplied from the laser oscillator shown in FIG. 13.

Although only the single laser 9 is employed for exciting the material atoms from the ground state to the Rydberg state in the embodiment described above, the material atoms in the ground state may be excited to the Rydberg state via an intermediate excited state by means of two lasers 9a and 9b of FIG. 13 having wavelength $\lambda_1$ and $\lambda_2$, respectively. Furthermore, the material atoms in the ground state may be excited to the Rydberg state via a plurality of intermediate excited states by means of three or more lasers having respective wavelengthes different from each other.

When two lasers 9a and 9b having the wavelength $\lambda_1$ and $\lambda_2$ respectively are employed for exciting the material atoms in the ground state to the Rydberg state, the laser wavelength $\lambda_1$ of the laser 9a radiated from a dye laser oscillator 10a is set at 589.0 nm to optically excite the Na atoms from the ground state (3s state) to the intermediate excited state (3p state), while the laser wavelength $\lambda_2$ of the laser 9b radiated from a laser oscillator 10b is set at 413.1 nm to optically excite the material atoms from the intermediate excited state (3p state) to the Rydberg state. A mirror 30a for changing the light pass of the laser 9a toward the space between the first and second electrodes 70 and 8 and another mirror 30b through which the laser 9a reflected at the mirror 30a passes and by which the light pass of the laser 9b is changed are provided so that the incoming direction of the lasers 9a and 9b may be opposite to the direction of the Na atom current, and thelight pass of the laser 9 (a mixed laser consisting of the lasers 9a and 9b) may be coaxial with the Na atom current 12. In the embodiment of FIG. 13, a mirror of a dielectric material is used as the mirror 30b.

When the Na atom current 12 is irradiated with the lasers 9a and 9b, the Na atoms are excited from the ground state to the Rydberg state. Namely, the Na atoms are excited from the $3s^2S_{\frac{1}{2}}$ ground state to the $3p^2P_{3/2}$ state by the laser 9a (589 nm), and then excited to the Rydberg state of 20d in which a principal quantum number of the valence electron is "20" by the laser 9b (413.1 nm).

Since the Einstein's A coefficient in the $3s^2S_{\frac{1}{2}}$ to $3p^2P_{3/2}$ transition of the Na atom (transition wavelength 589 nm) is about $6.3 \times 10^7$ sec$^{-1}$, the minimum output power density of the laser 9a required for saturating the transition from the ground state to the $3p^2P_{3/2}$ state is about 10 W/cm².

Figure 15:
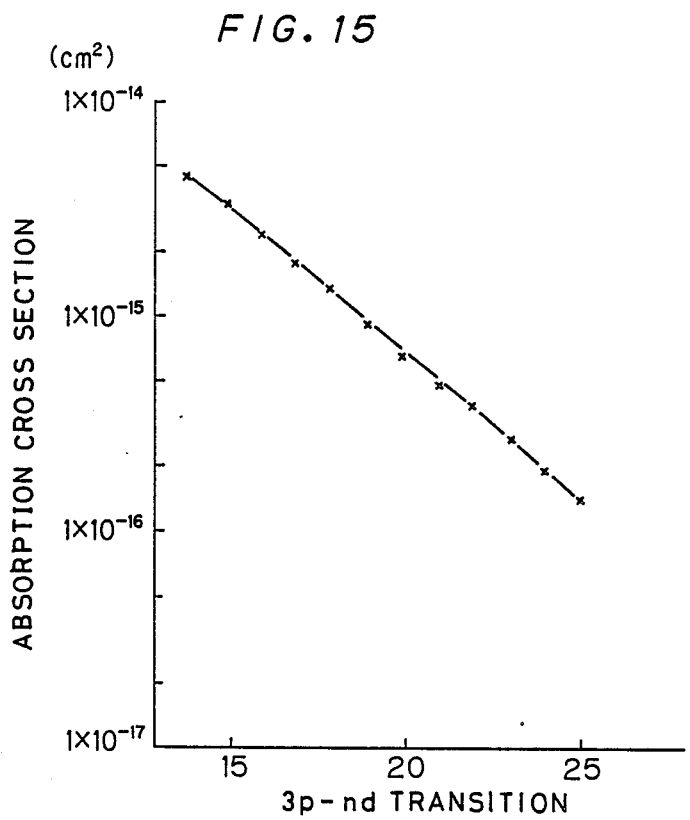
FIG. 15 is a graph showing the light absorption cross section of the Na atom when the Na atom is being excited from a $3p^2P_{3/2}$ state to a Rydberg nd state.

The light absorption cross section of the Na atom in the case where the Na atom is excited from the $3p^2P_{3/2}$ state to the nd Rydberg state has a value within the range from $10^{-14}$ cm² to $10^{-17}$ cm² depending on the principal quantum number (n) of the Rydberg state, as shown in FIG. 15. As seen from FIG. 15, the absorption cross section in the $3p^2P_{3/2}$ to 20d transition (transition wavelength 413.1 nm) is about $10^{-15}$ cm², and therefore, the minimum output energy density of the laser 9b required for saturating the transition from the $3p^2P_{3/2}$ state to the Rydberg state is about $10^4$ W/cm$^2$.

Although the above examples are given for the case where the lasers 9a and 9b are pulse lights and the material atoms are excited from the ground state to the Rydberg state via the intermediate excited state, the laser 9a employed for the extraction of the ion beam 14 may be as a continuous oscillation laser having relatively weak energy, since the laser output energy density required for optically exciting almost all atoms from the ground state to the Rydberg state may be as small as several one W/cm$^2$.

Further, since the transition cross section of the material atoms in the optical excitation from the intermediate excited state to the Rydberg state is $10^{-14}$ to $10^{-\sim}$ cm$^2$ and the life time of the Rydberg state is as long as several ten $\mu$s, the optical excitation from the intermediate excited state to the Rydberg state can be almost fully achieved even if the laser 9b is a continuous oscillation laser having a relatively weak energy. For example, when the Na atoms are excited from the $3p^2P_{3/2}$ state to the 20d state, the transition is saturated by a laser having an ouput energy density of at least about several ten W/cm$^2$.

Figure 16:
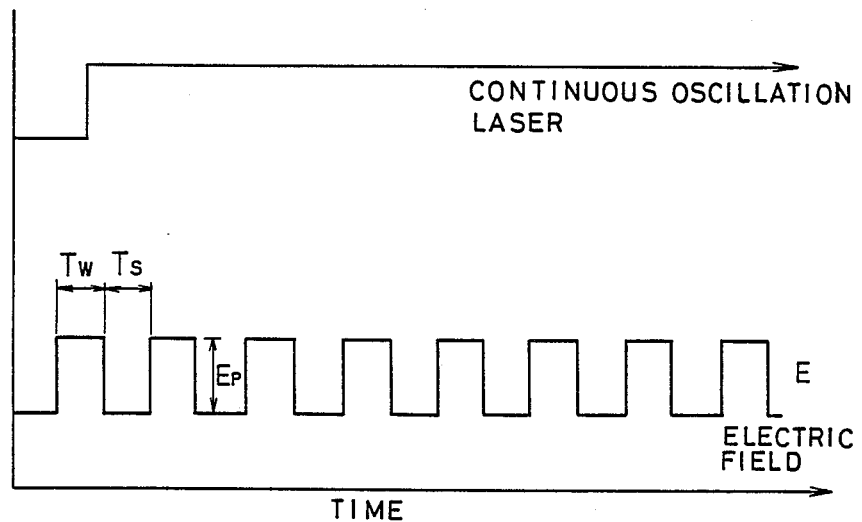
FIG. 16 is a time chart showing another supply timing of the laser and another application timing of the electric field in the embodiment shown in FIG. 10.

In such a case, the supply timing of the laser 9 and the application timing of the electric field E can be set as shown in FIG. 16, for example. When a continuous oscillation laser is employed, atoms in the Rydberg state are continuously supplied to the space between the first and second electrodes 70 and 8, so that the extraction frequency of the ion beam per unit time is identical to the frequency of the pulse electric field E applied to the space between the first and second electrodes 70 and 8. Therefore, an ion beam having about several one mA/cm$^2$ can be generated when the application of the electric field E is repeated with a frequency of about 1 MHz.

When a static electric field is applied to the space between the first and second electrodes 70 and 8, the value of the ion current which can be extracted is determined by the number of atoms in the Rydberg state supplied to the space between the first and second electrodes 70 and 8, since all of the atoms in the Rydberg state supplied to the space between the first and second electrodes 70 and 8 are ionized to be extracted to the exterior as an ion current. Accordingly, a high purity ion beam having about several one mA/cm$^2$ can be continuously extracted without difficulty.

Although the embodiment is described for generation of a Na ion beam, the present invention can be applied to ion beam generation using arbitrary atoms and/or molecules, since the character of a Rydberg state is determined essentially in dependence on the principal quantum number (n), in either atoms or molecules. For example, when it is desired to generate a Ga ion beam, the oscillation wavelength $\lambda_1$ of the dye laser 10a is set at 403.3 nm which is the transition wavelength of the transition from a ground state to a 5s excited state of Ga and the oscillation wavelength $\lambda_2$ of the dye laser 10b is set at the transition wavelength of the 5s to np transition which is shorter than 430 nm, so that the Ga ion beam can be generated similarly to the above described operation.

Figure 17:
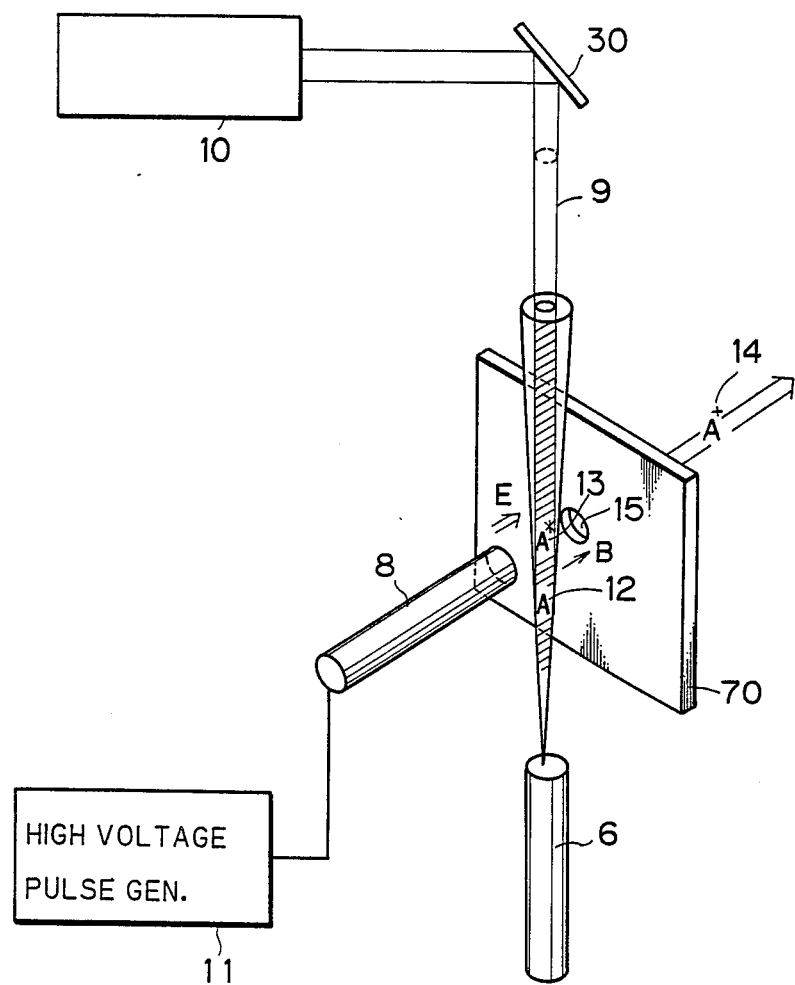
FIG. 17 to FIG. 20 are diagrams showing ion current generators according to second to fifth embodiments of the present invention, respectively.

FIG. 17 is a diagram showing an ion current generator according to the second embodiment of the present invention. The second embodiment is so constructed not only that the construction of the first embodiment shown in FIG. 10 is employed therein, but that a magnetic field B is applied to the space between the first and second electrodes 70 and 8 in parallel to the electric field E to suppress the spread of the ion being led to the first electrode 70. The magnetic field B may be applied by winding a coil around a space including the first and second electrodes 70 and 8 therein and adjusting an electric current supplied thereto, or by providing a permanent magnet other than the electrodes. Another construction to give the magnetic field B may be employed. Although it is preferred that the magnetic field B applied to the space between the first and the second electrodes 70 and 8 is in parallel direction with the electric field E, it may be out of parallel direction with the electric field E.

Figure 18:
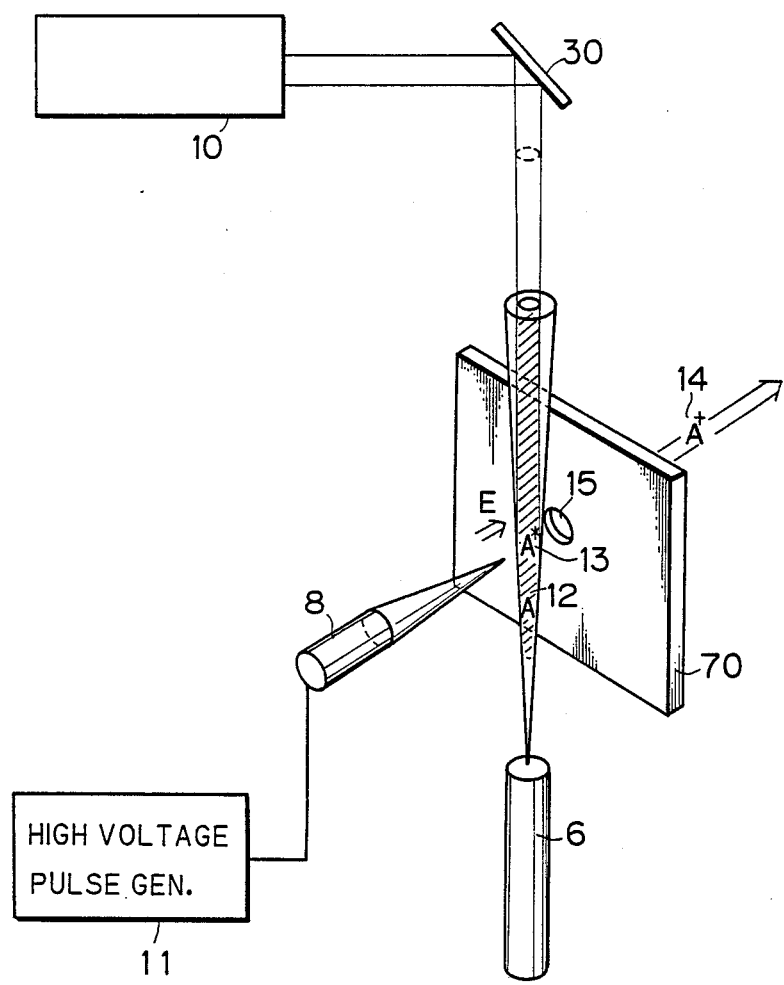

FIG. 18 is a diagram showing an ion current generator according to the third embodiment of the present invention. The third embodiment is identical to the first embodiment shown in FIG. 10 except for the shape of the second electrode 8. As shown in FIG. 18, the second electrode 8 in the third embodiment is a needle type electrode consisting of a lod-shaped base part and a sharp tip part. When such an electrode is employed, the electric field E is concentration on the tip part, so that the region in which the ionization is caused is restricted to a small region and the focusing of the ion beam is improved.

Figure 19:
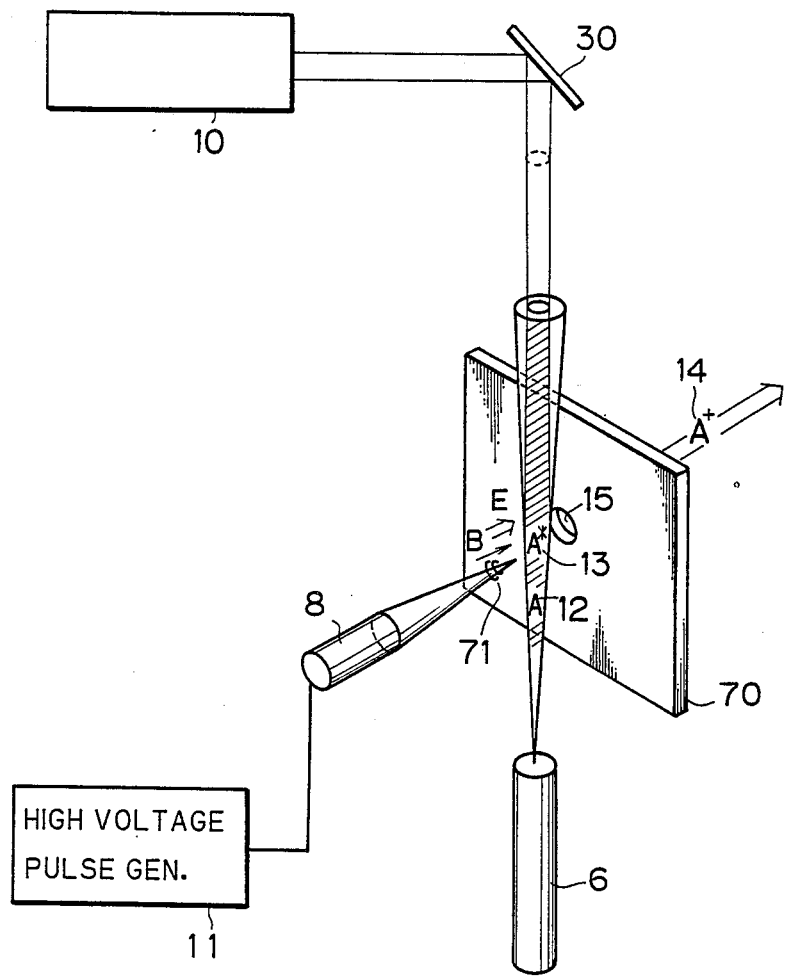

FIG. 19 is a diagram showing an ion current generator according to the fourth embodiment of the present invention. The fourth embodiment is constructed to be identical to the third embodiment shown in FIG. 18, except that a coil 71 of a superconductor whose resistivity is zero $\Omega$ cm in a temperature range below the liquid nitrogen temperature is wound around the tip part of the second electrode 8 so as to contact the tip part, and the second electrode 8 is refrigated to a temperature equal to or around the liquid nitrogen temperature. According to the fourth embodiment, a permanent current flowing in the superconductor coil 71 generates the magnetic field B without power loss. Since the electric field E and the magnetic field B are concentrated in the small region of the tip part, the space in which the material atoms are ionized is restricted to a small space and the spread of the ion beam is suppressed by the magnetic field B, so that the focusing of the ion beam is further improved.

Figure 20:
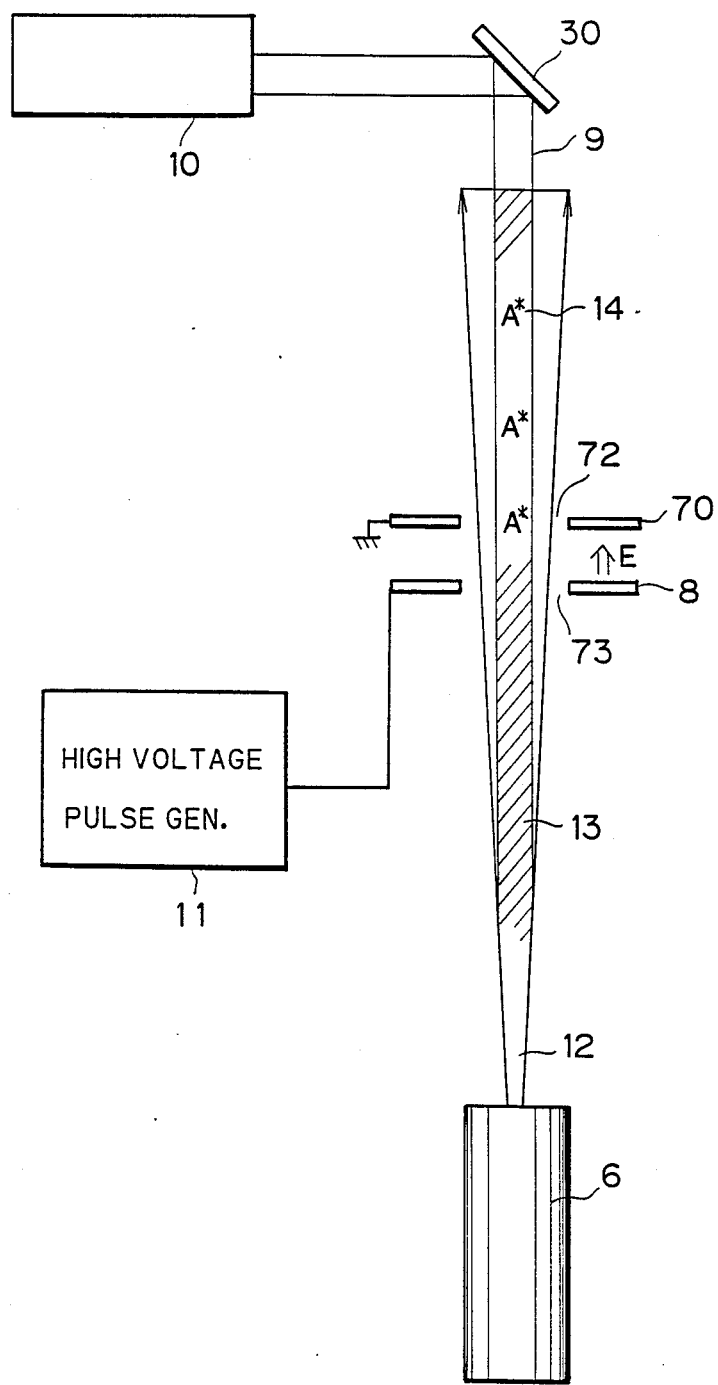

FIG. 20 is a diagram showing an ion current generator according to the fifth embodiment of the present invention. As shown in FIG. 20, the current generator has a first electrode 70 provided with a hole 72 having a predetermined shape nearby the center thereof, and a second electrode 8 provided with a hole 73 having a predetermined shape nearby the center thereof and facing the first electrode 70 in parallel. A vaporizer 6 (material atoms supply means) is provided below the second electrode 8 for supplying material atoms to be ionized to the space between the first and second electrodes 70, 8 through the hole 73 in the second electrode 8. Laser generating means 10 is given above the first and second electrodes 70, 8 for exciting certain material atoms included in an atom current 12 from a ground state to a Rydberg state. With a light pass adjuster 30, the light pass of a laser 9 outputted from the laser generating means 10 is so adjusted that the light pass of the laser may be coaxial with the atom current 12, and the incoming direction of the laser 9 may be opposite to the current direction of the atom current 12. A voltage generator 11 is connected with the second electrode 8 for applying a pulse electric field or a static electric field to the space between the first and second electrodes 70, 8.

According to the fifth embodiment, Rydberg atoms 13 excited by the laser 9 is supplied to the space between the first and second electrodes 70 and 8 through the hole 73 in the second electrode 8, and then ionized by the electric field E applied in the space between the first and second electrodes 70 and 8, so that the generated ions are extracted as an ion beam 14 through the hole 72 in the first electrode 70. Since the respective hole 72, 73 provided in the electrodes 70, 8 are aligned in the current path of the atom current 12 and in the light path of the laser 9, all of the atoms supplied to the space between the first and second electrodes 70, 8 can be extracted as the ion beam 14.

In the fifth embodiment, a magnetic field may be applied to the space between the first and second electrodes 70, 8 in parallel with the electric field E. In this case, the spread of the ion beam introduced to the first electrode 70 can be suppressed. The magnetic field may be applied by winding a coil around the space including the first and second electrodes 70, 8 and adjusting the electric current supplied to the coil, or by providing a permanent magnet at a predetermined position. Although it is preferred that the magnetic field is applied to the space between the first and second electrodes 70, 8 in parallel with the electric field E, the magnetic field may be applied in other direction.

Although the embodiment is described in the case where the ion beam of atoms or molecules is generated, the embodiment may be employed also as an ion current generator generating an ion beam having rich isotope atoms of a certain species when the line width of the laser for excitation to a Rydberg state is narrowed so that only uranium 235 ($^{235}U$) being an isotope of uranium may be selectively ionized.

C. Systems Having Ion Current Generator

Figure 21:
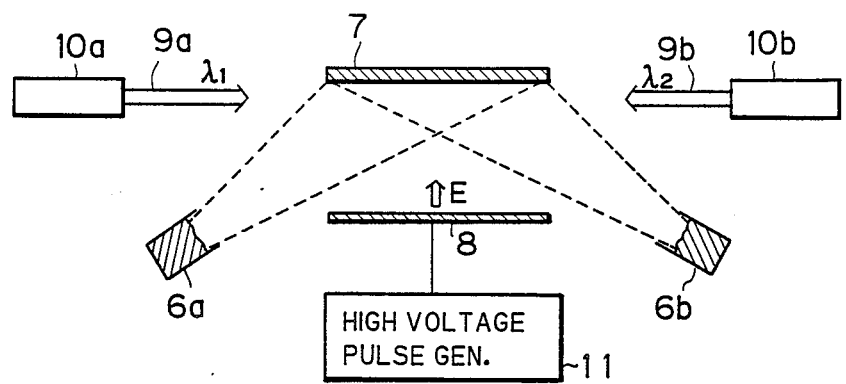
FIG. 21 and FIG. 22 are cross sections of first and second embodiments of a system having an ion current generator according to the present invention, respectively.

FIG. 21 is a cross section showing a first embodiment of a thin film forming system having an ion current generator according to the present invention. Referring to FIG. 21, the system is adapted to form a thin film on the lower surface of the substrate 7. In parallel to the substrate 7, a flat plate electrode 8 is so provided as to face the substrate 7. Vaporizers 6a and 6b (material atoms supply means) are adapted to vaporize material atoms required for the thin film formation, to supply the vaporized material atoms to the space between the substrate 7 and the electrode 8. In the system, two laser oscillators 10a and 10b are provided. The laser oscillator 10a generates a laser 9a having wavelength $\lambda_1$ for exciting material atoms of certain species from a ground state to an intermediate state, while the other laser oscillator 10b generates a laser 9b having wavelength $\lambda_2$ for exciting material atoms in the intermediate state to a Rydberg state. The electrode 8 is connected to a high voltage pulse generator 11 which applies a high voltage pulse to the electrode 8, to generate a pulse electric field E in the space between the electrode 8 and the substrate 7.

According to the thin film formation system, within the atom current supplied from the vaporizers 6a and 6b, only material atoms of certain species whose excitation energy corresponds to the excitation wavelength of the laser 9a and 9b are selectively excited from the ground state to the Rydberg state. Then, the excited material atoms are ionized by the electric field E applied to the space between the electrode 8 and the substrate 7, to be supplied on the surface of the substrate 7 as an ion beam, so that a thin film is formed on the substrate 7.

For example, in the case where a compound semiconductor film of indium phosphide (InP) is to be formed on the substrate 7, phosphorus (P) and indium (In) are prepared in the vaporizers 6a and 6b, respectively. By heating the vaporizers 6a and 6b, atom currents of phosphorus and indium are generated to be supplied to the space between the substrate 7 and the electrode 8.

Where indium is to be ionized for an ion beam epitaxial growth process, the respective wavelengthes $\lambda_1$ and $\lambda_2$ of the lasers 9a and 9b are set at 410.3 nm corresponding to the 5p to 6s transition wavelength and about 448.6 nm corresponding to the 6s to 25p transition wavelength, respectively. When both of the lasers 9a and 9b are pulse lasers, the lasers 9a and 9b and the electric field E are applied in the timing shown in FIG. 5. The electric field E applied to the space between the substrate 7 and the electrode 8 is set at about 1 KV/cm, and the lasers 9a and 9b are focused at the position apart from the substrate 7 by about 1 mm. Under the condition, an In beam having beam velocity corresponding to low energy of about 100 eV collides with phosphous atoms supplied from the vaporizer 6a, or phosphorus layer existing on the substrate 7, so that InP is deposited on the substrate 7. Accordingly, an InP thin film of high quality is gradually formed on the substrate 7, as the supply of the lasers 9a and 9b and the application of the electric field E are repeated.

Although the thin film is formed through the ionization of In, in the above described example, similar thin film can be formed by ionizing phosphorus with lasers having wavelength corresponding to excitation wavelength of phosphorus, or alternatively, by ionizing both of indium and phosphorus.

The embodiment shown in FIG. 21 is also employed for forming a gallium arsenide (GaAs) thin film on the substrate 7 as a compound semiconductor film, without an essential change of the construction. Namely, in the case where Ga is to be ionized for ion beam epitaxial growth, the wavelength $\lambda_1$ of the laser 9a is set at 403.3 nm corresponding to the 4p to 5s transition wavelength and the wavelength $\lambda_2$ of the other laser 9b is set at about 434 nm corresponding to 5s to 25p transition wavelength. The other conditions are set similarly to the case for forming the InP film.

Figure 22:
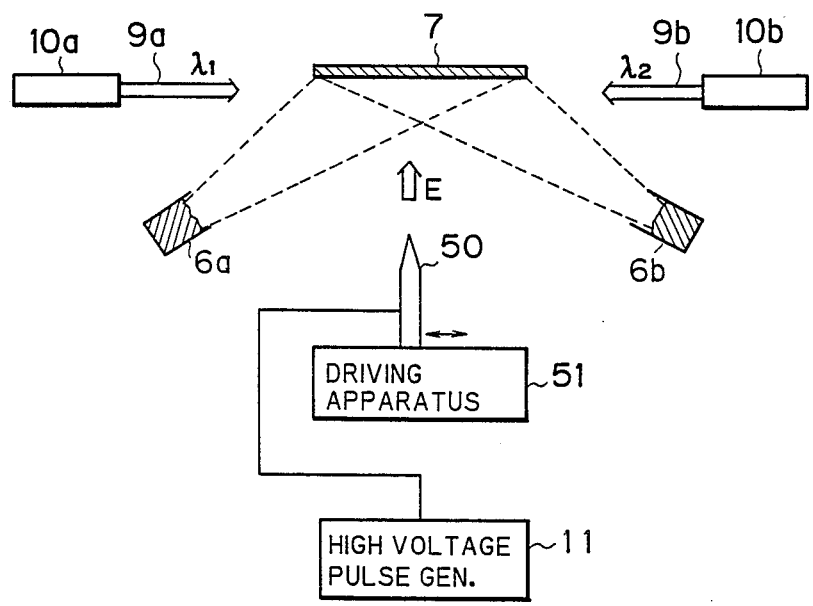

FIG. 22 is a cross section showing a second embodiment of a thin film forming system having an ion current generator of the present invention. In the second embodiment, a needle electrode 50 is employed in place of the electrode 8 of FIG. 21. The electrode 50 is mounted on a driving apparatus 51 to be moved the electrode 50 to a desired position therewith. The other constructions are similar to those of the system shown in FIG. 21. By employing the needle electrode 50, the electric field E required for ionizing the material atoms excited to the Rydberg state by the lasers 9a and 9b is concentrated in the tip part of the electrode 50, so that the ionization region is restricted to be small. As a result, the ion beam is accurately supplied only to the area on the substrate 7 facing the electrode 50, so that the thin film can be accurately formed on a prescribed region on the substrate 7 by moving the electrode 50 to the position corresponding to the prescribed region by means of the driving apparatus 51.

For example, an indium phosphide (InP) thin film as a compound semiconductor film can be formed on the substrate 7 under the condition almost similar to those of the embodiment shown in FIG. 21. However, a condition required for adjusting the strength of the electric field E to about 1 KV/cm is different from that required in the system of FIG. 21. For example, in the second embodiment, the tip part of the electrode 50 is so formed as to have a radius of curvature of 50 $\mu$m, the distance between the substrate 7 and the electrode 50 is set at 2 mm, and a voltage of 30V is applied to the electrode 50, so that the electric field strength nearby the tip part of the electrode 50 is adjusted to about 1 KV/cm. The other condition is set in the same way as the embodiment shown in FIG. 21. Under the condition, the irradiation with the lasers 9a, 9b and the application of the electric field E are repeated while moving the electrode 50 by the driving apparatus 51 to the position facing a desired region of the substrate 7 on which the InP thin film is to be formed, so that a high quality InP thin film having a desired shape is formed on the substrate 7.

Figure 23:
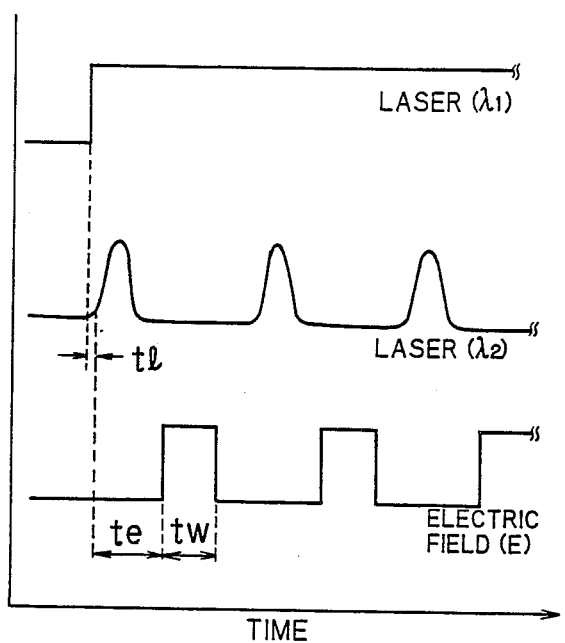
FIG. 23 is a timing chart showing examples of supply timing of the laser and application timing of the electric field in the embodiment shown in FIG. 21 or FIG. 22.

Although pulse lasers are employed as the lasers 9a and 9b for exciting the material atoms from the ground state to the Rydberg state through the intermediate excited state in the embodiments shown in FIG. 21 and FIG. 22, respectively, the thin film can be obtained when a continuous oscillation laser whose energy is relatively small is used as the laser 9a, since laser energy density required for optically exciting almost all of the material atoms from the ground state to the intermediate excited state is several one W/cm$^2$. In this case, the supply timing of the lasers 9a and 9b whose excitation wavelengthes are $\lambda_1$ and $\lambda_2$, respectively, and the application timing of the electric field E may be set as shown in FIG. 23.

Figure 24:
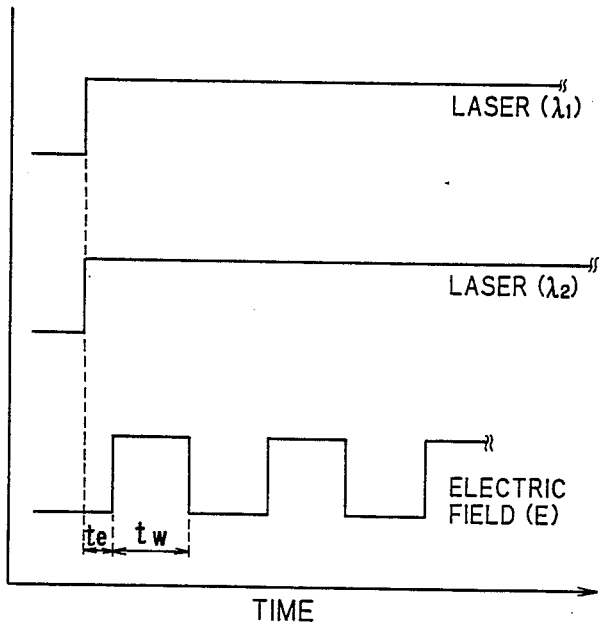
FIG. 24 is a timing chart showing other examples of supply timing of the laser and application timing of the electric field in the embodiment shown in FIG. 21 or FIG. 22.

Since the excitation cross section of the material atom in the photoexcitation from the intermediate excited state to the Rydberg state is 10$^{-18}$ cm$^2$ to 10$^{-14}$ cm$^2$ and the life time of the Rydberg state is longer than about several ten $\mu$s, almost all of the material atoms are optically excited from the intermediate excited state to the Rydberg state by the laser 9b supplied in the form of a continuous oscillation laser having a relatively small energy. In this case, the supply timing of the laser 9a and 9b whose excitation wavelengthes are $\lambda_1$ $\lambda_2$, respectively, and the application timing of the electric field E may be set as shown in FIG. 24.

Although two lasers 9a and 9b having wavelengthes $\lambda_1$ and $\lambda_2$ respectively are employed for exciting the material atoms from the ground state to the Rydberg state in the embodiments shown in FIG. 21 and FIG. 22 respectively, only a single laser having shorter wavelength than that of the lasers 9a and 9b may be used to excite the material atoms from the ground state to the Rydberg state, or alternatively, three or more lasers whose respective wavelengthes are different from each other may be used to excite the material atoms in the ground state to the Rydberg state via a plurality of intermediate excited states.

In the embodiments shown in FIG. 21 and FIG. 22 respectively, the lasers 9a and 9b supplied in parallel to the surface of the substrate 7 may be deflected periodically in the direction perpendicular to the drawing of FIG. 21 or FIG. 22 by means of a mirrors or optical dispersion elements such as prisms while synchronizing the respective deflections with each other so that the lasers 9a and 9b may be focused at a common position which is periodically moved in accordance with the periodical deflections. In such a case, the laser irradiated space is moved within a plane facing the substrate 7 while reserving the distance between the laser irradiated space and the substrate 7, so that a thin film having further uniform thickness is formed on the substrate 7.

When the laser focused position is restricted to be in a prescribed space between the substrate 7 and the electrodes 8, the thin film can be formed only on the part of the substrate 7 facing the prescribed space. Therefore, a thin film having a desired pattern can be formed on the substrate 7, by moving the laser focusing position along the pattern.

Figure 25:
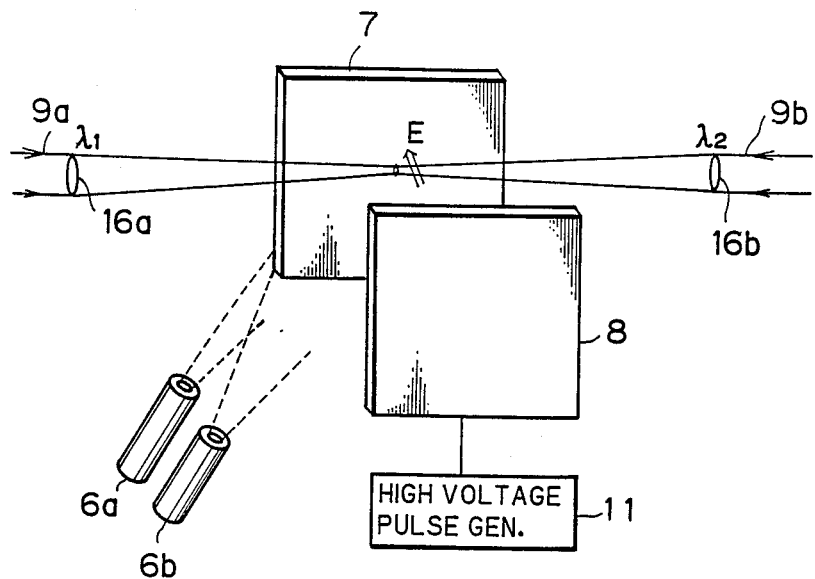
FIG. 25 to FIG. 28 are perspective views of third to sixth embodiments of a system according to the present invention, respectively.

FIG. 25 shows an example in which the lasers 9a and 9b are focused by the lens system 16a and 16b, respectively, and a thin film is formed on a certain small region on the substrate 7. In the thin film forming system shown in FIG. 25, the thin film is formed only on a certain region facing a space to which both of the lasers 9a and 9b are focused.

Figure 26:
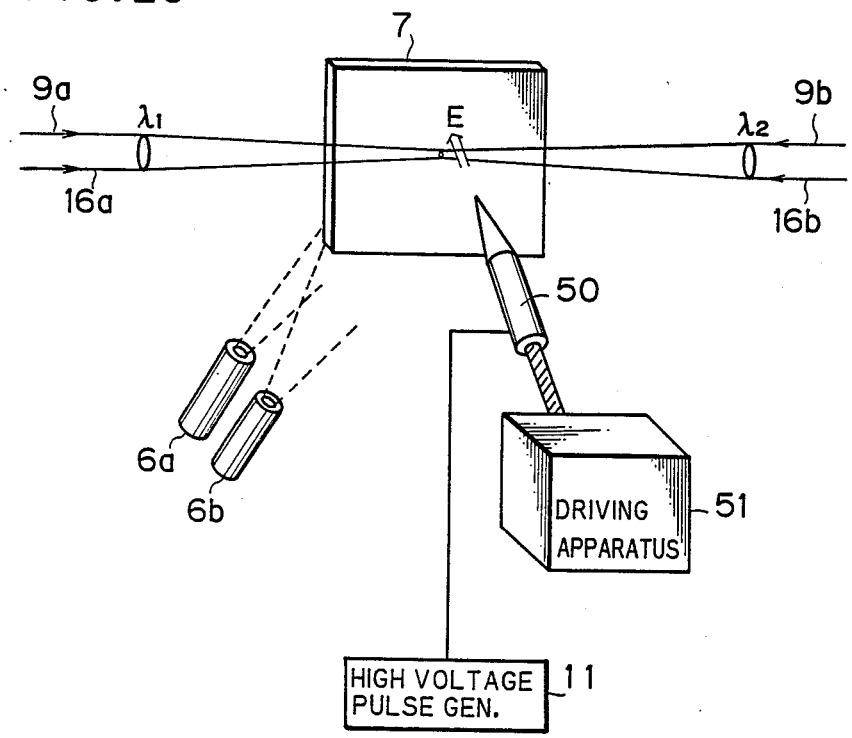

FIG. 26 shows another example in which a needle electrode 50 movable by a driving apparatus 51 is provided in place of the flat plate electrode 8 shown in FIG. 25. When the common focusing position of the lasers 9a and 9b is moved by the periodical deflections similar to those in FIG. 25 in synchronism with the movement of the electrode 50, a thin film pattern in accordance with the locus of the focusing position is formed on the substrate 7 in a high accuracy.

Figure 27:
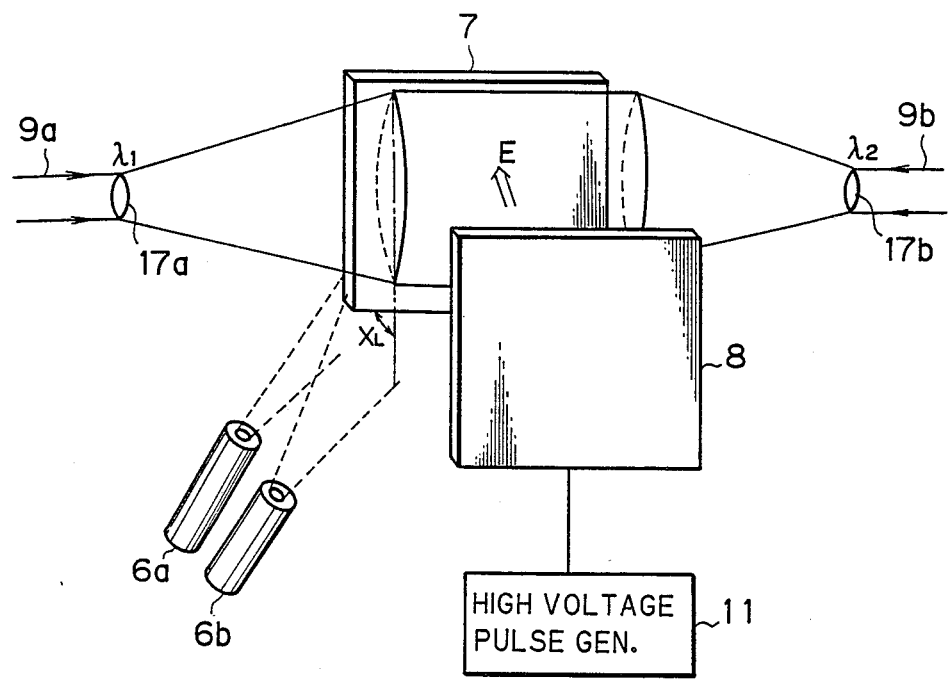

FIG. 27 shows further another example in which the lasers 9a and 9b are expanded in their section along the vertical direction in FIG. 27 by mean of lens systems 17a and 17b such as cylindrical lens. The respective light passes of the lasers 9a and 9b have sheet like shapes parallel to the surface of the substrate 7 for overlapping each other at the area facing the surface of said substrate 7. According to the example of FIG. 27, a thin film having a uniform thickness can be formed on the substrate 7, even if the surface area of the substrate 7 is large. Further, the energy or the velocity of the ion beam supplied to the substrate 7 can be easily adjusted by changing the distance $X_L$ between the laser focusing position and the substrate 7, so that a desired thin film can be easily formed.

Figure 28:
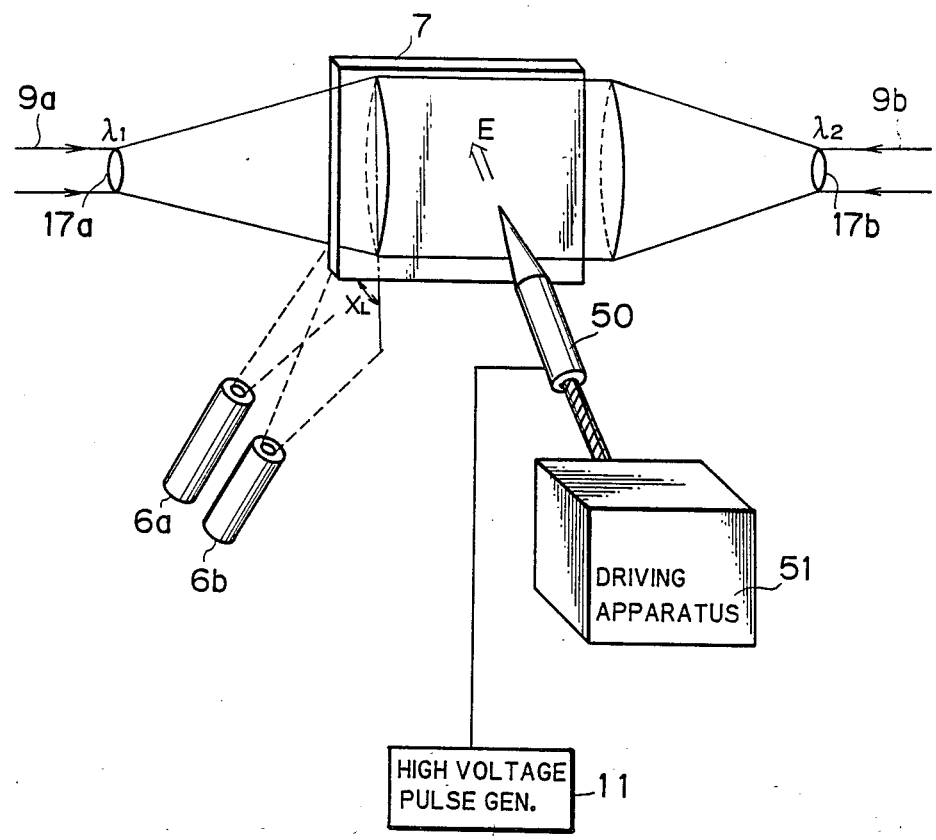

FIG. 28 shows another example in which a needle electrode 50 is provided in place of the plate electrode 8 in FIG. 27. According to the example of FIG. 28, both of the respective advantages of the embodiments of FIG. 26 and FIG. 27 are obtained. When the sections of the lasers having sheet like shape are thinned, th energy dispersion of the ion beam is suppressed, so that the thin film can be formed under an optimum condition.

Figure 29:
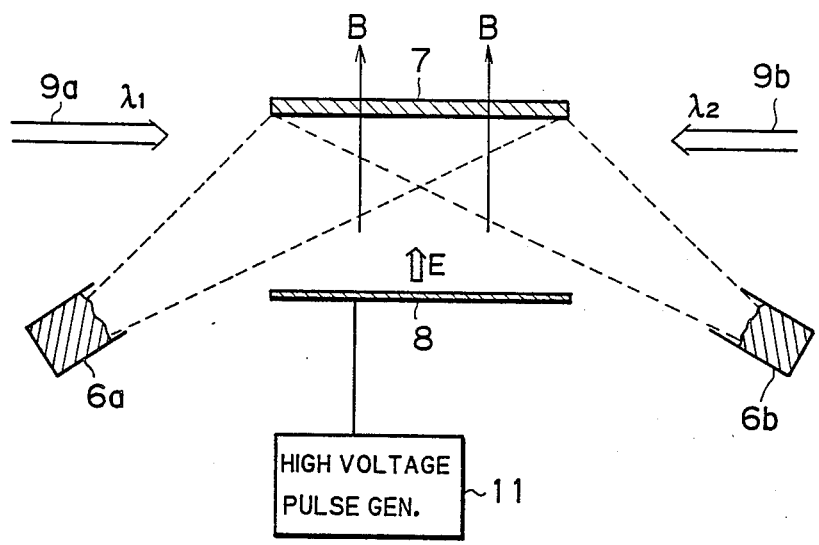
FIG. 29 to FIG. 32 are cross sectional views of seventh to tenth embodiments of a system according to the present invention, respectively.
Figure 30:
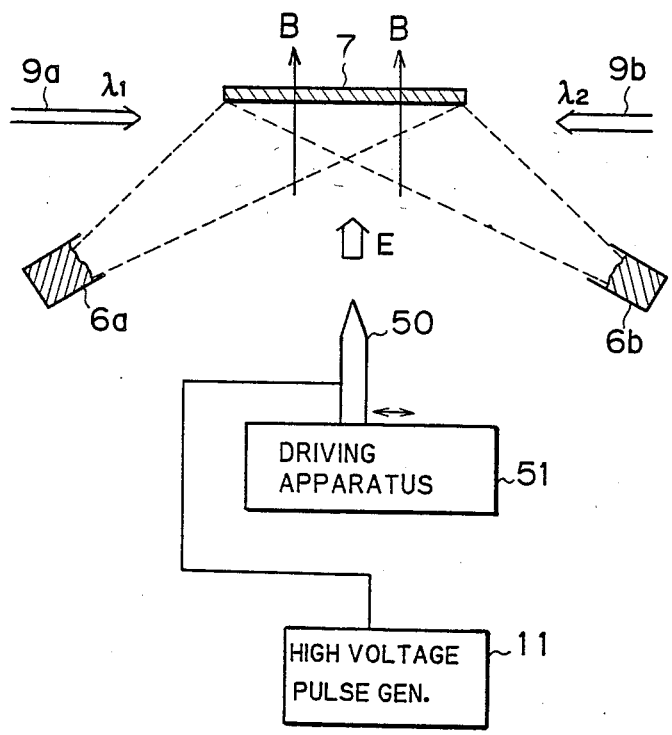

FIG. 29 and FIG. 30 are diagrams showing seventh and eighth embodiments of a thin film forming system having an ion current generator of the present invention, respectively. These embodiments are so constructed that a magnetic field B is applied to the space between the substrate 7 and the electrode 8 (or 50) in parallel to the electric field E so as to suppress the spread of the ion beam led to the substrate 7. The magnetic field B may be generated by a coil provided around a space including the substrate 7 and the electrode 8 (or 50) and adjusting the electric current supplied in the coil, or by a permanent magnet provided at a predetermined position. The magnetic field B and the electric field E may be not in parallel to each other, although it is preferred that they are in parallel to each other.

Figure 31:
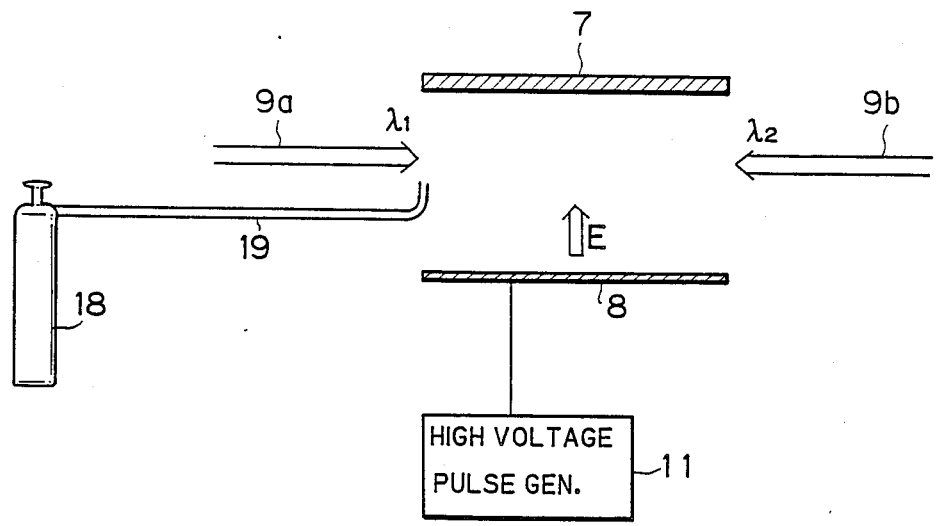
Figure 32:
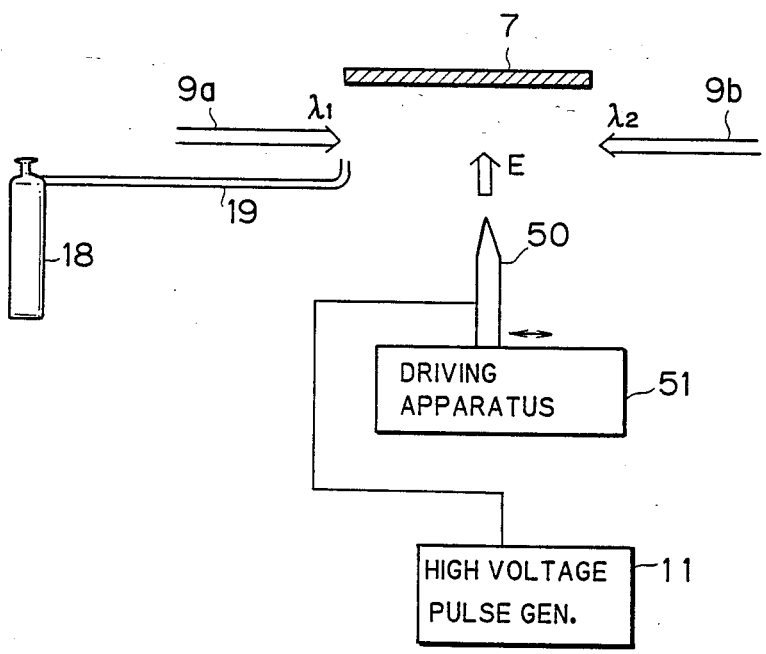

FIG. 31 and FIG. 32 are cross sections showing ninth and tenth embodiments of thin film forming systems having an ion current generator of the present invention, respectively. These embodiments are so constructed that the material atoms to be used for forming a thin film are supplied to the space between the substrate 7 and the electrode 8 (or 50) as a molecule current including the material atoms, in place of the atom current. A gas bomb 18 is filled with a molecular gas, which is supplied to the space between the substrate 7 and the electrode 8 (or 50) as the molecule current through a leading pipe 19 connected to the gas bomb 18. When both of the atom current and the molecule current are used together to supply the material atoms to the space between the substrate 7 and the electrode 8 (or 50), either the material atoms included in the atom current or those in the molecule current may be ionized.

Further, when the current direction of the atom current or the molecule current is so determined as to be parallel to the surface of the substrate 7, most of impurities included in the atom or molecule current are prevented from entering the thin film formed on the substrate 7 and the quality of the thin film becomes high.

Figure 33:
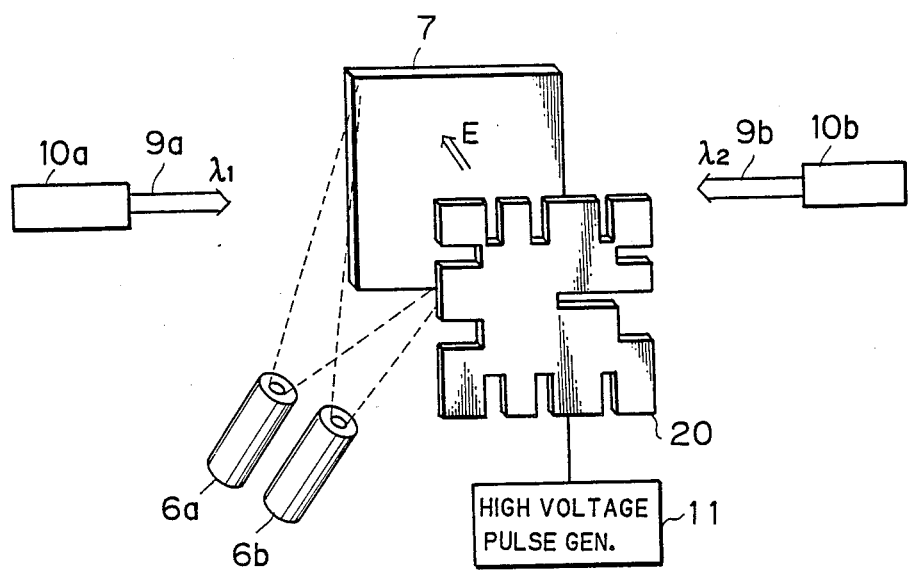
FIG. 33 to FIG. 40 are perspective views of eleventh to eighteenth embodiments of a system according to the present invention, respectively.

FIG. 33 is a perspective view of eleventh embodiment of a thin film forming system having an ion current generator of the present invention. In this embodiment, a patterned electrode 20 having a conductive portion whose shape is so determined as to correspond to the shape of a part of the substrate 7 on which a thin film is to be formed is used in place of the flat plate electrode 8 of FIG. 21. The other construction is the same as the system of FIG. 21. Through employment of the patterned electrode 20, the electric field E required for ionizing the material atoms excited to the Rydberg state by the lasers 9a and 9b is applied only to the space between the patterned electrode 20 and the substrate 7. Accordingly, the ion beam is accurately supplied only to the region on the substrate (thin film forming programmed region) facing the conductive portion of the electrode 20, so that the thin film is accurately formed on a prescribed region on the substrate 1 corresponding to the pattern of the conductive portion. The patterned electrode 20 may be constructed only by the conductive portion shown in FIG. 33, or alternatively, it may be constructed by integrating the patterned conductive portion with an insulating film (not shown). In latter case, the electrode 20 may be fabricated by selectively etching a conductive layer provided on the insulating film by means of photolithography, or by forming a patterned conductive film on the insulating film.

Figure 34:
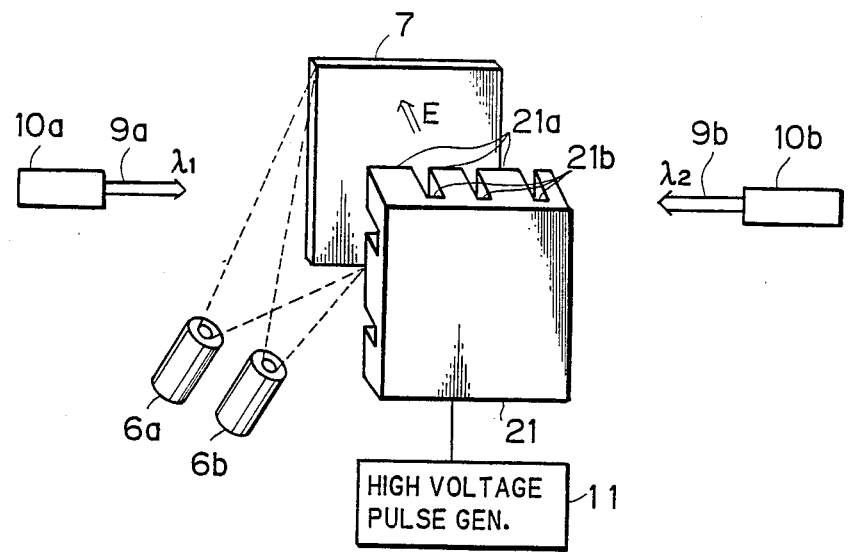

FIG. 34 is a perspective view showing a twelfth embodiment, in which an electrode 21 is used in place of the electrode 20 of FIG. 33 and the other construction is the same as FIG. 33. A part of the electrode 21 facing the substrate 7 is shaped unevenly so that the region facing an area of the substrate 7 on which a thin film is to be formed may be relatively close to the substrate 7 and the other region facing the other area of the substrate 7 on which no thin film is to be formed may be relatively far from the substrate 7. When a pulse voltage generated in a high voltage pulse generator 11 is applied to the electrode 21 to generate a pulse electric field E in the space between the electrode 21 and the substrate 7, the electric field E in the space on a convex part 21a is stronger than that in the space on a concave part 21b. The distance between the electrode 21 and the substrate 7 is so determined that the electric field E has a strength over the threshold level required for the ionization of the material atoms in the Rydberg state, only in the space on the convex part 21a of the electrode 21. Under the conditions, only the material atoms existing in the space between the substrate 7 and the convex part 21a are ionized in high efficiency and the ion beam thus generated are accurately supplied only to the region of the substrate 7 on which a thin film is to be formed, so that the thin film is accurately formed on the desired region on the substrate 7. The inventors of the present invention carried out an experiment for forming an InP thin film, in which the wavelengthes of the lasers 9a and 9b were set at 410.3 nm and 448.6 nm, respectively, the lasers 9a, 9b were supplied to the position apart from the substrate 7 by about 1 mm, the distances from the convex part 21a and the concave part 21b to the substrate 7 were set at 5 mm and 10 mm, respectively, and a voltage of 500V was applied to the electrode 21 to generate the electric field E. Through the experiment, it was confirmed that only the In atoms existing in the space between the substrate 7 and the convex part 21a were ionized, an In ion beam of about 100 eV was supplied to the substrate 7, and an InP thin film was formed only on the region of the substrate 7 facing the convex part 21a.

Figure 35:
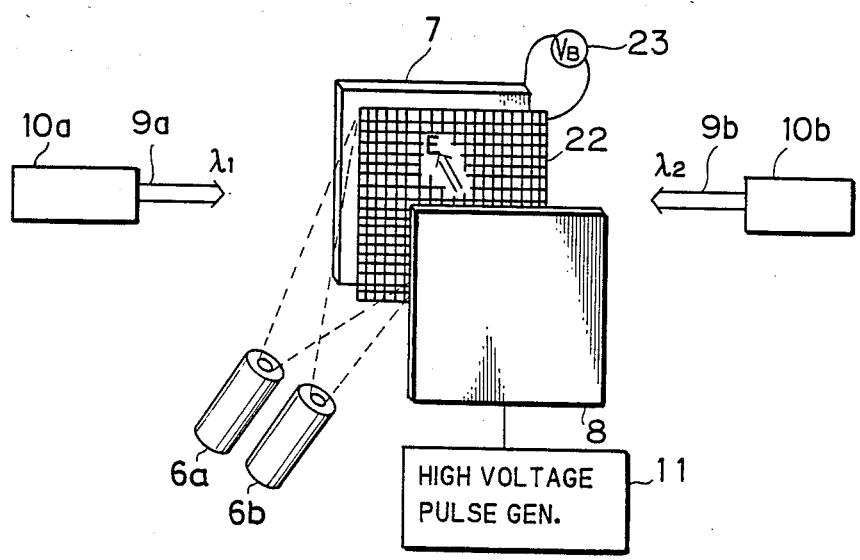

FIG. 35 shows a thirteenth embodiment, which has the same construction as the system of FIG. 21 except that another electrode 22 is provided between the substrate 7 and the electrode 8 for controlling the velocity of the ion beam. The electrode 22 is a mesh electrode having many small holes so that the ion beam can pass therethrough. A power source 23 is provided for applying a bias voltage between the mesh electrode 22 and the substrate 7. The atom current supplied from the vaporizers 6a and 6b, and the lasers 9a and 9b are supplied to the space between the electrodes 8 and 22. The other construction is the same as the system of FIG. 21.

The lasers 9a and 9b are focused in the space between the electrodes 8 and 22, and then the electric field E is applied to the space between the substrate 7 and the electrode 8. Only the material atoms to be used for forming the thin film are selectively ionized in the laser focusing position at high efficiency and accelerated by the electric field E to become an ion beam, to be led to the mesh electrode 22. The ion beam is accelerated or decelerated by the electric field applied to the space between the mesh electrode 22 and the substrate 7, to be supplied to the substrate 7 as an ion beam having a uniform energy lower than 100 eV, so that a desired thin film is accurately formed on the substrate 7.

The inventors carried out an experiment under the condition that the mesh electrode 22 was arranged at a position apart from the substrate 7 by 1 mm, the lasers 9a and 9b were focused on a spot area having a diameter of about 1 mm $\phi$ and being apart from the substrate 7 by 5 mm, and the electric field of 5 KV/cm was applied to the space between the electrodes 8 and 22. In the experiment, it was observed that the energy of the ion beam was about 2 keV when the bias voltage of the electrode 22 is zero V and it was about 200 eV when the bias voltage was 1500 V. From the result of the experiment, it is confirmed that the energy of the ion beam is easily adjusted by changing the bias voltage.

Another experiment for forming an InP thin film on the substrate 7 was also carried out. The respective wavelengthes of the lasers 9a and 9b were set at 410.3 nm and 448.6 nm, respectively, and the lasers 9a and 9b were supplied to the position apart from the bias electrode 22 by about 5 mm. The strength of the electric field E was set at about 1 KV/cm, and a DC bias voltage of −450 V was applied to the mesh electrode 22. Under the condition, an In ion beam having energy of about 500 eV was generated to be supplied on the substrate 7, so that an InP thin film of high quality was formed.

Figure 36:
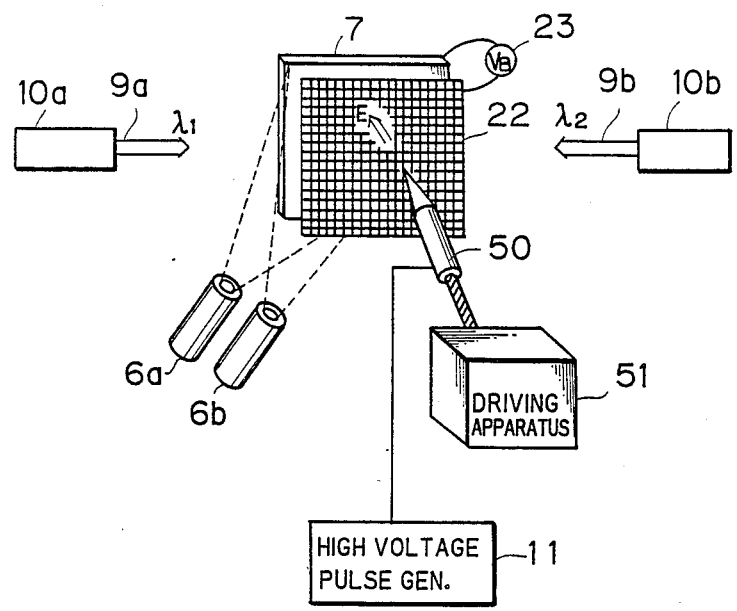

FIG. 36 shows a fourteenth embodiment, in which a needle electrode 50 is employed in place of the plane electrode 8 shown in FIG. 35. For moving the electrode 50 to a desired position, a driving apparatus 51 is connected with the electrode 50. The other construction is the same as the system of FIG. 35. In the fourteenth embodiment, the velocity of the ion beam supplied the substrate 7 is accurately controlled by the function of the mesh electrode 22, and a thin film having a desired pattern can be accurately formed on the substrate 7 by moving the electrode 50 with the driving apparatus 51.

Figure 37:
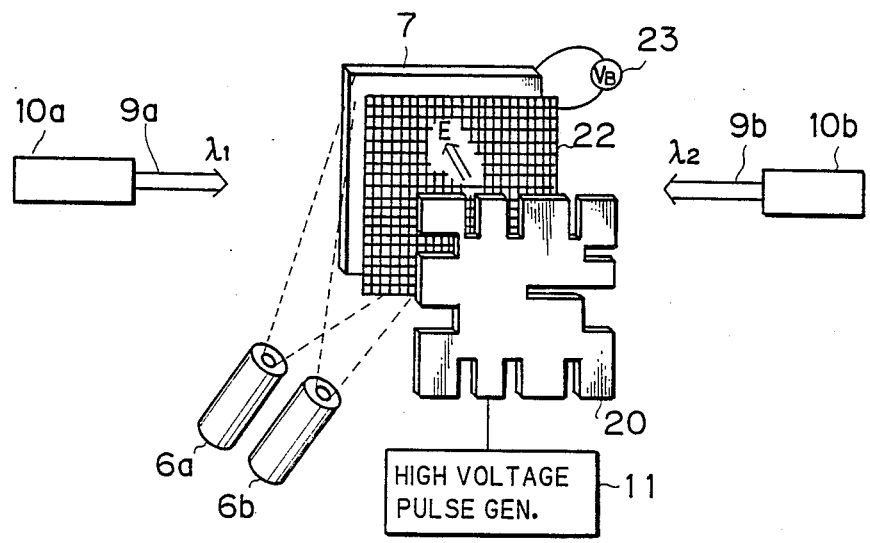
Figure 38:
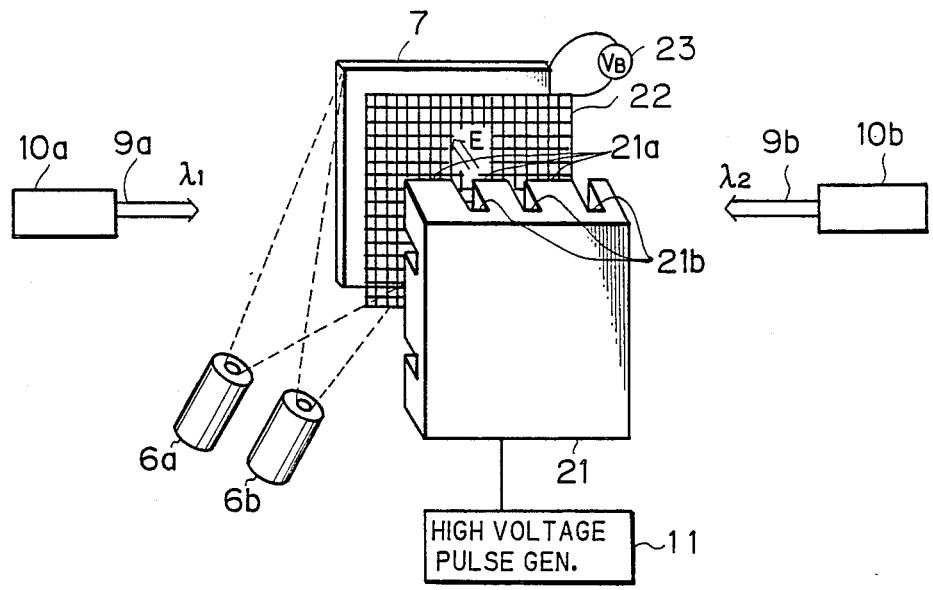

FIG. 37 and FIG. 38 show fifteenth and sixteenth embodiments, respectively. The constructions of these embodiments are the same as the system of FIG. 35 except that the electrode 20 in FIG. 33 or the electrode 21 in FIG. 34 is employed in place of the electrode 8 shown in FIG. 35. In these embodiments shown in FIG. 37 and FIG. 38, the velocity of the ion beam supplied to the substrate 7 is accurately controlled by the function of the mesh electrode 22, and a thin film can be accurately formed only on a certain region on the substrate 7 by the function of the electrode 20 or 21.

An experiment was carried out with respect to the system of FIG. 37, under the condition that the wavelengthes of the lasers 9a and 9b were 410.3 nm and 448.6 nm, respectively, the lasers 9a and 9b were supplied to the postion apart from the bias electrode 22 by about 5 mm, the strength of the electric field E was about 1 KV/cm, and a DC bias voltage of $-450$ V was applied to the mesh electrode 22. In the experiment, an In ion beam having energy of about 50 eV was generated to be supplied only to the region on the substrate 7 facing the conductive portion of the electrode 20, and a high quality InP thin film was accurately formed on the desired region on the substrate 7. An experiment with respect to the system of FIG. 38 was also carried out, in which the wavelengthes of the lasers 9a and 9b were the same as the experiment of the system of FIG. 37, the distance between the convex part 21b of the electrode 21 and the substrate 7 was 5 mm, the distance between the concave part 21b and the substrate 7 was 10 mm, a voltage of 500 V was applied to the electrode 21, and a DC bias voltage of $-150$ V was applied to the mesh electrode 22. The result was that In atoms were ionized only in the space on the convex part 21a to be converted to an ion beam having energy of about 50 eV, which was supplied to the substrate 7, and on InP thin film was accurately formed only on the region on the substrate 7 facing the convex part 21a.

Figure 39:
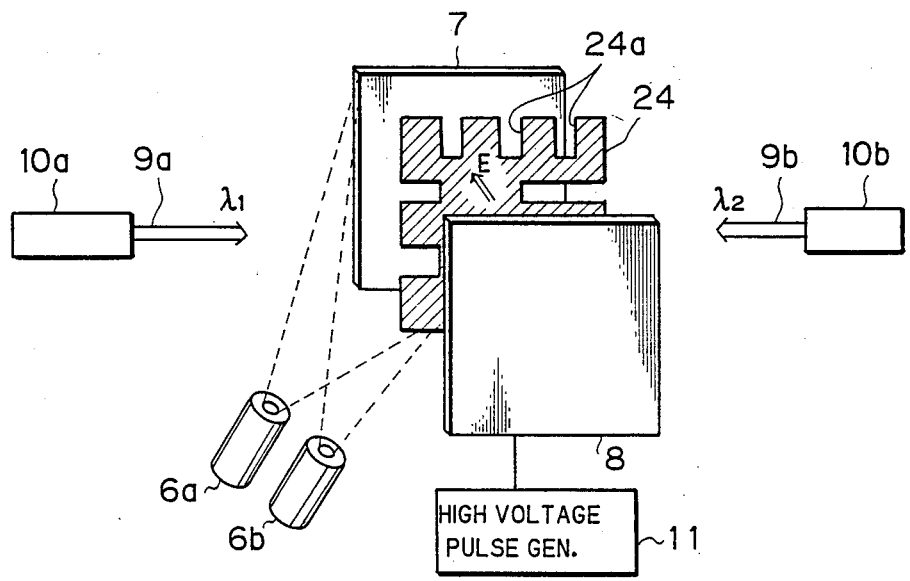

FIG. 39 shows a seventeenth embodiment. The difference between the seventeenth system and the system of FIG. 21 is only in that the mask 24 formed to allow an ion beam to pass through the mask 24 only in an area facing the region on the substrate 7 on which a thin film is to be formed is provided between the substrate 7 and the electrode 8, in the former system. The mask 24 is made from ion beam unpermeable substance such as a metal or the like, and provided with an ion beam passing window 24a opened in the area facing the region on the substrate 7 on which the thin film is to be formed. In this system, an atom current from the vaporizers 6a and 6b and the lasers 9a and 9b are supplied to the space between the mask 24 and the electrode 8. Other construction is the same as the system of FIG. 21.

According to the seventeenth embodiment, the lasers 9a and 9b are supplied to the space between the mask 24 and the electrode 8, and then, an electric field E is applied to the space between the substrate 7 and electrode 8, so that only material atoms to be used for forming the thin film are selectively ionized at high efficiency in the position to which the lasers 9a and 9b are supplied, and accelerated by the electric field E to become an ion beam to be led to the mask 24. A part of the ion beam having come to the ion beam passing window 24a passes through the window 24a without any interference, to be supplied to the substrate 7, while the other part of the ion beam having come to the other region of the mask 24 is interrupted by the ion beam unpermeable substance. As a result, the ion beam is accurately supplied only to the region of the substrate 7 on which the thin film is to be formed, and a high quality thin film is accurately formed on the desired region of the substrate 7.

Figure 40:
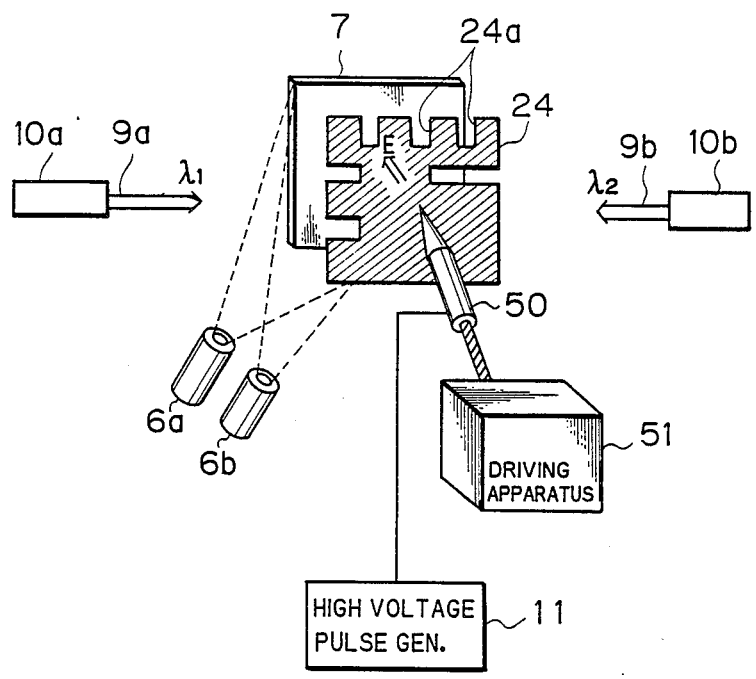

FIG. 40 shows an eighteenth embodiment. The construction of the embodiment is identical to that of the system of FIG. 39, except that the needle electrode 50 is provided in place of the electrode 8 of FIG. 39, and a driving apparatus 51 is provided for moving the electrode 50 to arbitrary position. In the system of FIG. 40, a part of an ion beam having come to the ion beam passing window 24a passes through the window 24a without any interference, to be supplied to the substrate 7, while the other part of the ion beam having come to the other region of the mask 24 interrupted by the ion beam unpermeable substance, similarly to in the system of FIG. 39. Accordingly, when the electrode 50 is moved so that the surface of the substrate 7 may be scanned, the ion beam is accurately supplied only to the region of the substrate 7 on which the thin film is to be formed, and a high quality thin film is accurately formed on a desired region on the substrate 7.

The mask 24 may have a construction obtained by integrating an ion beam passing layer made from plastic or the like with a metal layer (ion beam unpermeable layer) having a shape patterned according to the shape of the region of the substrate 7 on which the thin film is to be formed.

Further, the mask 24 may be a conductive layer made from a metal or the like to which a bias voltage is applied so that the velocity of the ion beam is controlled therewith.

An experiment with respect to the eighteenth embodiment employed for forming an InP thin film on the substrate 7 was carried out, in which the wavelengthes of the lasers 9a and 9b were 410.3. nm and 448.6 nm, respectively, the lasers 9a and 9b were supplied to a position apart from the mask 24 by about 1 mm, and the strength of the electric field E was set at about 1 KV/cm. Under the condition, an In ion beam having energy of about 100 eV was supplied to the substrate 7 through the ion beam passing window 24a, and a high quality InP thin film was accurately formed on a desired region on the substrate 7.

Although the embodiments of FIG. 21 to FIG. 40 have been described as systems employed for forming a compound semiconductor thin film (InP, GaAs etc.) on the substrate 7, these embodiments may be employed for forming another film on the substrate 7, which may be an atomic film made from a monoatom such as Si, Ge or the like, an oxide film, a nitride film or the like.

These systems may be also employed for separating isotope uranium 235 ($^{235}U$) from uranium (U). In this case, the line width of the laser is set to be smaller than the difference between respective excitation wavelengthes of isotope atoms, and the central wavelength of the laser is set at the excitation wavelength of $^{235}U$. Accordingly, within uranium atoms included in an atomic current, only the isotope uranium 235 is selectively excited to a Rydberg state to be ionized, and an uranium 235 thin film is formed on the substrate 7.

Further, the systems shown in FIG. 21 to FIG. 40 may be used as ion implantation systems, rather than the thin film forming systems. In this case, the atomic current is generated so as to include material atoms to be used to ion implantation, which is P, As or the like, and then subjected to the ionization. The strength of the electric field E is set to be higher than ten and several KV. The ion beam thus obtained has a high kinetic energy, and the ions included therein are implanted into a substrate at a high velocity.

The systems shown in FIG. 21 to FIG. 40 can be used as etching systems. Namely, the atom current is generated so as to include atoms or molecules used for etching process, which is atoms of flurine (F), chlorine (Cl) or the like, and to be subjected to the ionization. The ion beam thus obtained is supplied to a layer on a substrate to etch the same.

When the strength of the electric field E is so increased that the ion beam has enough velocity to sputter atoms existing on the surface of the substrate, the systems shown in FIG. 21 to FIG. 40 can be used as sputtering systems.

Although the present invention has been described and illustrated in detail, it is clearly understood that the same is by way of illustration and example only and is not to be taken by way of limitation, the spirit and scope of the present invention being limited only be the terms of the appended claims.

We claim:

1. An ion current generator comprising:
   material atoms supply means for supplying a particle current having material atoms to a predetermined region;
   laser generating means for supplying laser radiation to said region to excite said material atoms to a Rydberg state; and
   electric field application means for applying a predetermined electric field to said material atoms in said Rydberg state so that said material atoms are ionized to be led to a predetermined direction, wherein said electric field application means includes:
   a substrate,
   an electrode provided to face said substrate, and
   a power source for supplying a predetermined electric potential to said electrode to generate an electric field between said substrate and said electrode wherein said electrode has a surface facing said substrate, said surface being irregularly shaped so as to have a first region spaced from said substrate by a first distance and a second region spaced from said substrate by a second distance where said second distance is greater than said first distance;
   said first region faces a region on said substrate to which an ion current is to be supplied and said second region faces a region on said substrate to which said ion current is not to be supplied.

2. An ion current generator in accordance with claim 1, wherein
   said particle current having said material atoms is supplied to a space between said substrate and said electrode, and
   a direction of said electric field is so determined that said material atoms which are ionized are led from said electrode to said substrate.

3. An ion current generator in accordance with claim 1 wherein
   said laser generating means generates a plurality of laser radiations having respective wavelengths which are different from each other, said material atoms being excited by said laser radiations from a ground state to said Rydberg state via an intermediate state through a multi-stage excitation.

4. An ion current generator in accordance with claim 3, wherein
   at least one of said laser radiations is a pulse laser, and
   said electric field is applied to a space between said substrate and said electrode after said pulse laser is supplied to said material atoms and before a life time of said Rydberg state to which said material atoms are excited by said pulse laser is over.

5. An ion current generator in accordance with claim 4, wherein
   said electric field is a pulse electric field having a frequency identical to an oscillation frequency of said pulse laser.

6. An ion current generator in accordance with claim 3, wherein
   said laser generating means generates two lasers having respective wavelengths which are different from each other,
   said ion current generator further comprising means for expanding said two lasers in two dimensional direction respectively so that respective light passes of said two lasers have sheet like shapes parallel to a surface of said substrate for overlapping each other at an area facing the surface of said substrate.

7. An ion current generator in accordance with claim 3, wherein
   said material atoms are gallium atoms,
   a laser having wavelength of 403.3 nm is supplied to said gallium atoms to excite said gallium atoms from a ground state to an intermediate state, and
   another laser having wavelength shorter than 434 nm is supplied to said gallium atoms to excite said gallium atoms from said intermediate state to said Rydberg state.

8. An ion current generator in accordance with claim 3, wherein
   said material atoms are indium atoms,
   a laser having wavelength of 410.3 nm is supplied to said indium atoms to excite said indium atoms from a ground state to an intermediate state, and
   another laser having wavelength shorter than 449 nm is supplied to said indium atoms to excite said indium atoms from said intermediate state to said Rydberg state.

9. An ion current generator in accordance with claim 1, further comprising means for orientating said laser radiation to a direction parallel to a surface of said substrate.

10. An ion current generator in accordance with claim 1, further comprising means for focusing said laser radiation in a certain space between said substrate and said electrode.

11. An ion current generator in accordance with claim 10, further comprising means for periodically deflecting said laser radiation along a certain direction in a plane parallel to a surface of said substrate.

12. An ion current generator in accordance with claim 1, wherein
a distance between a space to which said laser radiation is supplied and a surface of said substrate is set so that a value of a product of said distance and a strength of said electric field is equal to or less than 300 V.

13. An ion current generator in accordance with claim 1, wherein
said material atoms supply means supplies said particle current in a direction substantially parallel to a surface of said substrate.

14. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, said electric field application means including a substrate, and an electrode provided to face said substrate and a power supply for supplying a predetermined electric potential to said electrode to generate an electric field between said substrate and said electrode wherein said electrode has a sharp tip part facing said substrate and wherein said ion current generator further comprises a driving apparatus for relatively moving said electrode in a direction paralle to a surface of said substrate.

15. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, said electric field application means having a substrate, a first electrode provided to face said substrate, a first power source for giving a predetermined electric potential to said first electrode to generate an electric field in a space between said substrate and said first electrode, a second electrode provided between said substrate and said first electrode and so constructed that an ion current can pass through said second electrode, and a second power source for giving a control electric potential to said second electrode controlling a velocity of said ion current, wherein said first electrode has a surface facing said substrate,
said surface is irregularly spaced so as to have a first region spaced from said first substrate by a first distance and a second region spaced from said substrate at a second distance which is greater than said first distance,
said first region faces a region on said substrate to which an ion current is to be supplied, and
said second region faces a region on said substrate to which said ion current is not to be supplied.

16. An ion current generator in accordance with claim 15, wherein
said particle current having said material atoms is supplied to a space between said first electrode and said second electrode, and
a direction of said electric field is so determined that said material atoms which are ionized are led from said first electrode to said substrate.

17. An ion current generator in accordance with claim 15, wherein
said second electrode is a mesh electrode.

18. An ion current generator in accordance with claim 15, wherein
said laser generating means generates lasers having respective wavelengths which are different from each other, said material atoms being excited by said lasers from a ground state to said Rydberg state via an intermediate state through a multi-stage excitation.

19. An ion current generator in accordance with claim 18, wherein
at least one of said lasers is a pulse laser, and
said electric field is applied to a space between said first electrode and said substrate after said pulse laser is supplied to said material atoms and before a life time of said Rydberg state to which said material atoms are excited by said pulse laser is over.

20. An ion current generator in accordance with claim 19, wherein
said electric field is a pulse electric field having a frequency identical to an oscillation frequency of said pulse laser.

21. An ion current generator in accordance with claim 18, wherein
said material atoms are gallium atoms,
a laser having wavelength of 403.3 nm is supplied to said gallium atoms to excite said gallium atoms from a ground state to an intermediate state, and
another laser having wavelength shorter than 434 nm is supplied to said gallium atoms to excite said gallium atoms from said intermediate state to said Rydberg state.

22. An ion current generator in accordance with claim 18, wherein
said material atoms are indium atoms,
a laser having wavelength of 410.3 nm is supplied to said indium atoms to excite said indium atoms from a ground state to an intermediate state, and
another laser having wavelength shorter than 449 nm is supplied to said indium atoms to excite said indium atoms from said intermediate state to said Rydberg state.

23. An ion current generator in accordance with claim 15, further comprising means for orientating said laser radiation to a direction parallel to a surface of said substrate.

24. An ion current generator in accordance with claim 15, further comprising means for focusing said laser radiation in a certain space between said first electrode and said second electrode.

25. An ion current generator in accordance with claim 24, further comprising means for periodically deflecting said laser along a certain direction in a plane parallel to a surface of said substrate.

26. An ion current generator in accordance with claim 15, wherein said material atoms supply means supplies said particle current in a direction substantially parallel to a surface of said substrate.

27. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means includes a substrate, a first electrode provided to face said substrate, a first power source for giving a predetermined electric potential to said first electrode to generate an electric field in a space between said substrate and said first electrode, a second electrode provided between said substrate and said first electrode and so constructed that an ion current can pass through said second electrode, and a second power source for giving a controlled electric potential to said second electrode for controlling a velocity of said ion current and wherein said first electrode has a sharp tip part facing said substrate, said generator further comprising a driving apparatus for relatively moving said first electrode in a direction parallel to a surface of said substrate.

28. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means includes a substrate, an electrode provided to face said substrate, and a power source for supplying a predetermined electric potential to said electrode to generate an electric field between said substrate and said electrode, said generator further comprising a mask provided between said substrate and said electrode, said mask being so constructed that an ion current can pass through said mask only in an area facing a region on said substrate to which said ion current is to be supplied.

29. An ion current generator in accordance with claim 28, wherein
said particle current including said material atoms is supplied between said mask and said electrode, and
a direction of said electric field is so set that said material atoms which are ionized are led from said electrode to said substrate.

30. An ion current generator in accordance with claim 28, wherein
said electrode is shaped according to a shape of said substrate.

31. An ion current generator in accordance with claim 28, wherein
said electrode has a sharp tip part facing said substrate.

32. An ion current generator in accordance with claim 31, further comprising a driving apparatus for relatively moving said electrode in a direction parallel to a surface of said substrate.

33. An ion current generator in accordance with claim 28, wherein
said mask is made from an ion current unpermeable substance and shaped according to a shape of a region on said substrate to which an ion current is to be supplied.

34. An ion current generator in accordance with claim 28, wherein
said mask is constructed by providing an ion current unpermeable layer on an ion current permeable layer, said ion current unpermeable layer having a shape patterned on a shape of a region on said substrate to which an ion current is to be supplied.

35. An ion current generator in accordance with claim 28, wherein
said mask is made from a conductive material, and
said ion current generator further comprises a control power source for supplying a control electric potential to said mask to control a velocity of an ion current being led to said substrate.

36. An ion current generator in accordance with claim 28, wherein
said laser generating means generates lasers having respective wavelengths which are different from each other, said material atoms being excited by said lasers from a ground state to said Rydberg state via an intermediate state through a multi-stage excitation.

37. An ion current generator in accordance with claim 36, wherein
at least one of said lasers is a pulse laser, and
said electric field is applied to a space between said electrode and said substrate after said pulse laser is supplied to said material atoms and before a life time of said Rydberg state to which said material atoms are excited by said pulse laser is over.

38. An ion current generator in accordance with claim 37, wherein
said electric field is a pulse electric field having a frequency identical to an oscillation frequency of said pulse laser.

39. An ion current generator in accordance with claim 36, wherein
said material atoms are gallium atoms,
a laser having wavelength of 403.3 nm is supplied to said gallium atoms to excite said gallium atoms from a ground state to an intermediate state, and
another laser having wavelength shorter than 434 nm is supplied to said gallium atoms to excite said gallium atoms from said intermediate state to said Rydberg state.

40. An ion current generator in accordance with claim 36, wherein
said material atoms are indium atoms,
a laser having wavelength of 410.3 nm is supplied to said indium atoms to excite said indium atoms from a ground state to an intermediate state, and
another laser having wavelength shorter than 449 nm is supplied to said indium atoms to excite said indium atoms from said intermediate state to said Rydberg state.

41. An ion current generator in accordance with claim 28, further comprising means for orientating said laser radiation to a direction parallel to a surface of said substrate.

42. An ion current generator in accordance with claim 28, further comprising means for focusing said laser radiation in a certain space between said mask and said electrode.

43. An ion current generator in accordance with claim 42, further comprising means for periodically deflecting said laser radiation along a certain direction in a plane parallel to a surface of said substrate.

44. An ion current generator in accordance with claim 28, wherein
said material atoms supply means supplies said particle current in a direction substantially parallel to a surface of said substrate.

45. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means comprises a first electrode provided with a hole through which an ion current is extracted, a second electrode facing said first electrode, and a power supply for supplying a predetermined electric potential to at least one of said first and second electrodes to generate an electric field in a space between said first electrode and said second electrode, wherein said particle current having said material atoms is supplied to said space between said first electrode and said second electrode from one side of said space, said laser radiation is supplied to said space between said first electrode and said second electrode from another side of said space, a light path of said laser radiation being coaxially with a current path of said particle current, and a direction of said electric field is so set that said material atoms which are ionized are led from said second electrode to said first electrode.

46. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means includes a first electrode provided with a hole through which an ion current is extracted, a second electrode facing said first electrode, and a power source for supplying a predetermined electric potential to at least one of said first and second electrodes to generate an electric field in a space between said first electrode and said second electrode, wherein a surface of said second electrode facing said first electrode has a shape according to a shape of said hole provided in said first electrode.

47. An ion current generator comprising:
material atoms supply means for supplying a particle current having material atoms to a predetermined region;
laser generating means for supplying laser radiation to said region to excite said material atoms to a Rydberg state; and
electrical field application means for supplying a predetermined electric field to said material atoms in said Rydberg state so that said material atoms are ionized to be led to a predetermined direction, wherein said electric field application means comprises a first electrode divided with a hole through which an ion current is extracted, a second electrode facing said first electrode, and a power source for supplying a predetermined electric potential to at least one of said first and second electrodes to generate an electric field in a space between said first electrode and said second electrode, wherein said second electrode has a sharp tip part facing said first electrode, and wherein a coil made of a superconductor is provided on said shart tip part, and said second electrode is refrigerated by liquid nitrogen.

48. An ion current generator in accordance with claim 47, wherein
said laser generating means generates a plurality of laser radiations having respective wavelengths which are different from each other, said material atoms being excited by said laser radiations from a ground state to said Rydberg state via an intermediate state through a multi-stage excitation.

49. An ion current generator in accordance with claim 48, wherein
at least one of said laser radiations is a pulse laser, and said electric field is applied to a space between said first electrode and said second electrode after said pulse laser is supplied to said material atoms and before a life time of said Rydberg state to which said material atoms are excited by said pulse laser is over.

50. An ion current generator in accordance with claim 49, wherein
said electric field is a pulse electric field having a frequency identical to an oscillation frequency of said pulse laser.

51. An ion current generator in accordance with claim 48, wherein
said material atoms are gallium atoms,
a laser having wavelength of 403.3 nm is supplied to said gallium atoms to excite said gallium atoms from a ground state to an intermediate state, and
another laser having wavelength shorter than 434 nm is supplied to said gallium atoms to excite said gallium atoms from said intermediate state to said Rydberg state.

52. An ion current generator in accordance with claim 48 wherein
said material atoms are indium atoms,
a laser having wavelength of 410.3 nm is supplied to said indium atoms to excite said indium atoms from a ground state to an intermediate state, and
another laser having wavelength shorter than 449 nm is supplied to said indium atoms to excite said indium atoms from said intermediate state to said Rydberg state.

53. An ion current generator in accordance with claim 47, further comprising means for orientating said laser radiation to a direction parallel to a surface of said first electrode.

54. An ion current generator in accordance with claim 47, wherein
said electric field is a periodic pulse electric field, and
means for determining a pulse pause period of said periodic pulse electric field which exists between a pulse activated period and a next pulse activated period and which is set to be longer than a period required for said material atoms included in said particle current to pass through a region between said first and second electrodes to which said electric field is applied.

55. An ion current generator comprising:
material atoms supply means for supplying a particle current having material atoms to a predetermined region;
laser generating means for supplying laser radiation to said region to excite said material atom to a Rydberg state; and
electrical field application means applying a predetermined electric field to said material atoms in said Rydberg state so that said material atoms are ionized to be led to a predetermined direction, wherein said electric field application means comprises:
a first electrode provided with a first hole for extracting an ion current in a predetermined region of said first electrode,
a second electrode facing said first electrode and having a second hole for supplying said material atoms in a region of said second electrode facing said first hole, and
a power source for giving a predetermined electric potential to at least one of said first and second electrodes to generate an electric field in a space between said first electrode and said second electrode, said particle current which includes said material atoms being supplied to said space between said first electrode and said second electrode through said second hole.

56. An ion current generator in accordance with claim 55, wherein
said laser generating means generates a plurality of laser radiations having respective wavelengths which are different from each other, said material atoms being excited by said laser radiations from a ground state to said Rydberg state via an intermediate state through a multi-stage excitation.

57. An ion current generator in accordance with claim 56, wherein
at least one of said laser radiations is a pulse laser, and
said electric field means is applied to said space between said first and second electrodes after said pulse laser is supplied to said material atoms and before a life time of said Rydberg state to which said material atoms are excited by said pulse laser is over.

58. An ion current generator in accordance with claim 57, wherein
said electric field is a pulse electric field having a frequency identical to an oscillation frequency of said pulse laser.

59. An ion current generator in accordance with claim 56, wherein
said material atoms are gallium atoms,
a laser having wavelength of 403.3 nm is supplied to said gallium atoms to excite said gallium atoms from a ground state to an intermediate state, and
another laser having wavelength shorter than 434 nm is supplied to said gallium atoms to excite said gallium atoms from said intermediate state to said Rydberg state.

60. An ion current generator in accordance with claim 56, wherein
said material atoms are indium atoms,
a laser having wavelength of 410.3 nm is supplied to said indium atoms to excite said indium atoms from a ground state to an intermediate state, and
another laser having wavelength shorter than 449 nm is supplied to said indium atoms to excite said indium atoms from said intermediate state to said Rydberg state.

61. An ion current generator in accordance with claim 55, wherein
said laser radiation is supplied to said space between said first electrode and said second electrode through said first hole, and
a light path of said laser radiation is coaxial with a current line of said particle current, a supply direction of said laser radiation being opposite to a current direction of said particle current.

62. An ion current generator in accordance with claim 61, wherein
said electric field is a periodic pulse electric field, and
means for determining a pulse pause period of said periodic pulse electric field which exists between a pulse activated period and a next pulse activated period and which is set to be longer than a period required for said material atoms included in said particle current to pass through a region between said first and second electrodes to which said electric field is applied.

63. An ion current generator in accordance with claim 55, wherein
said laser generating means generates a plurality of laser radiation having respective wavelengths which are different from each other, said material atoms being excited by said laser radiations from a ground state to said Rydberg state via an intermediate state through a multi-state excitation.

64. An ion current generator in accordance with claim 63, wherein
at least one of said laser radiations is a pulse laser, and
said electric field is applied to said material atoms in said Rydberg state after said pulse laser is supplied and before a life time of said Rydberg state to which said material atoms are excited by said pulse laser is over.

65. An ion current generator in accordance with claim 64, wherein
said electric field is a pulse electric field having a frequency identical to an oscillation frequency of said pulse laser.

66. An ion current generator in accordance with claim 55, wherein
said laser radiation is a continuous oscillation laser, and
said electric field is a periodic pulse electric field.

67. An ion current generator in accordance with claim 55, wherein
excitation wavelength of said laser radiation is set a wavelength required for exciting said material atoms to said Rydberg state having a principal quantum number of a valence electron which is equal to or larger than 20.

68. An ion current generator comprising:
material atoms supply means for supplying a particle current having material atoms to a predetermined region;
laser generating means for supplying laser radiation to said region to excite said material atoms to a Rydberg state; and
electric field applicatin means for applying a predetermined electric field to said material atoms in said Rydberg state so that said material atoms are ionized to be led to a predetermined direction, wherein a light path of said laser radiation is coaxial with a current line of said particle current, and a supply direction of said laser radiation is opposite to a current direction of said particle current.

69. An ion current generator in accordance with claim 68, further comprising magnetic field application means for applying a magnetic field in said predetermined region.

70. An ion current generator in accordance with claim 69, wherein said magnetic field is parallel to said electric field.

71. An ion current generator in accordance with claim 68, wherein
said material atoms include isotopes of a certain species, and
said laser radiation has a line width smaller than a difference between respective excitation wavelengths of said isotopes so that only a certain isotope included in said isotopes is excited by said laser radiation.

72. An ion current generator in accordance with claim 68, wherein
said material atoms supply means supplies
material atoms useable for thin film formation.

73. An ion current generator in accordance with claim 68, wherein
said material atoms supply means supplies
material atoms useable for ion implantation.

74. An ion current generator in accordance with claim 68, wherein
said material atoms supply means supplies
material atoms useable for sputtering.

75. An ion current generator in accordance with claim 68, wherein
said material atoms supply means supplies material atoms useable for etching.

76. An ion current generator comprising:
material atoms supply means for supplying a particle current having material atoms to a predetermined region;
laser generating means for applying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means include:
a substrate,
an electrode provided to face said substrate, and
a power source for supplying a predetermined electric potential to said electrode to generate an electric field between said substrate and said electrode, wherein said electrode has a conductive portion shaped according to a shape of a region on said substrate to which an ion current is to be supplied.

77. An ion current generator comprising:
material atoms supply means for supplying a particle current having material atoms to a predetermined region;
laser generating means for supplying laser radiation to said region to excite said material atoms to a Rydberg state; and
electric field application means for applying a predetermined electric field to said material atoms in said Rydberg state so that said material atoms are ionized to be led to a predetermined direction, wherein said electric field application means include:
a substrate,
a first electrode provided to face said substrate,
a first power source for giving a predetermined electric potential to said first electrode to generate an electric field in a space between said substrate and said first electrode,
a second electrode provided between said substrate and said first electrode and so constructed that an ion current can pass through said second electrode, and
a second power source for giving a control electric potential to said second electrode for controlling a velocity of said ion current said first electrode has a conductive portion shaped according to a shape of a region on said substrate to which an ion current is to be supplied.

* * * * *